US007232773B2

(12) United States Patent
Imai et al.

(10) Patent No.: US 7,232,773 B2
(45) Date of Patent: Jun. 19, 2007

(54) LIQUID DROP JETTING APPARATUS USING CHARGED BEAM AND METHOD FOR MANUFACTURING A PATTERN USING THE APPARATUS

(75) Inventors: Keitaro Imai, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 31 days.

(21) Appl. No.: 10/827,711

(22) Filed: Apr. 20, 2004

(65) Prior Publication Data

US 2005/0142896 A1 Jun. 30, 2005

(30) Foreign Application Priority Data

Apr. 25, 2003 (JP) ............................ 2003-121394

(51) Int. Cl.
*H01L 21/26* (2006.01)

(52) U.S. Cl. ................ 438/798; 438/795; 257/E21.476

(58) Field of Classification Search ................ 427/466, 427/469, 483, 472
See application file for complete search history.

(56) References Cited

U.S. PATENT DOCUMENTS 5,093,602 A 3/1992 Kelly (Continued)

FOREIGN PATENT DOCUMENTS

JP 05-501676 4/1993

(Continued)

OTHER PUBLICATIONS

Peter Van Zant; “Microchip Fabrication”; 5th Edition; McGraw-Hill; Copyright (c) 2004, 2000, 1997, 1984; pp. 47-48.*

(Continued)

*Primary Examiner*—Michael Lebentritt
*Assistant Examiner*—Cheung Lee
(74) *Attorney, Agent, or Firm*—Cook, Alex, McFarron, Manzo, Cummings & Mehler, Ltd.

(57) ABSTRACT

The invention drastically improves the accuracy of adhesion position of a liquid drop discharged by a liquid drop discharge method and makes it possible to form a fine and highly accurate pattern directly on a substrate. Therefore, one object of the invention is to provide a method for manufacturing a wiring, a conductive layer and a display device that can respond to upsizing of a substrate. Moreover, another object of the invention is to provide a method for manufacturing a wiring, a conductive layer and a display device that can improve throughput and the efficiency of use of material. The invention can improve the accuracy of adhesion position of a liquid drop drastically at the time of patterning a resist material, a wiring material, or the like directly by the liquid drop discharge method mainly on a substrate having an insulating surface. To be more specific, the invention is characterized in that: a liquid adhesion position on the surface of the substrate is scanned with a charged beam in accordance with a desired pattern immediately before a liquid drop is discharged by the liquid drop discharge method; and immediately thereafter, the liquid drop is charged with an electric charge of a polarity opposite to the charged beam and is discharged to improve the controllability of the adhesion position of the liquid drop to a great extent.

33 Claims, 10 Drawing Sheets

U.S. PATENT DOCUMENTS

| | | | | |
|---|---|---|---|---|
| 5,378,957 | A | 1/1995 | Kelly | |
| 6,127,082 | A | 10/2000 | Humberstone et al. | |
| 6,221,438 | B1 * | 4/2001 | Matthies | 427/466 |
| 2003/0054653 | A1 | 3/2003 | Yamazaki et al. | 438/694 |
| 2003/0190419 | A1 * | 10/2003 | Katagami et al. | 427/240 |
| 2004/0145692 | A1 | 7/2004 | Yamazaki et al. | |
| 2004/0147066 | A1 | 7/2004 | Yamazaki et al. | |
| 2004/0147113 | A1 | 7/2004 | Yamazaki et al. | |

FOREIGN PATENT DOCUMENTS

| | | |
|---|---|---|
| JP | 08-173858 | 7/1996 |
| JP | 11-509774 | 8/1999 |
| JP | 2002-359246 | 12/2002 |
| WO | WO 91/07772 | 5/1991 |
| WO | WO 97/02903 | 1/1997 |

OTHER PUBLICATIONS

International Search Report (Application No. PCT/JP2004/005011; PCT7118), Dated Aug. 17, 2004 (in Japanese).

Written Opinion (Application No. PCT/JP2004/005011; PCT 7118), Dated Aug. 17, 2004 (Partial translation).

* cited by examiner

FORMATION OF FIRST CONDUCTIVE LAYER

FORMATION OF FIRST CONDUCTIVE LAYER

FORMATION OF INTERLAYER INSULATING FILM

FORMATION OF SECOND CONDUCTIVE LAYER

FORMATION OF CONTACT HOLE

CONTINUOUSLY DISCHARGING ABOVE CONTACT HOLE

CONTINUOUS FORMATION ABOVE CONTACT HOLE

LIQUID DROP JETTING APPARATUS USING CHARGED BEAM AND METHOD FOR MANUFACTURING A PATTERN USING THE APPARATUS

TECHNICAL FIELD

The present invention relates to a liquid drop discharge apparatus for producing a fine pattern directly on a substrate and a method for forming a wiring or forming a pattern of a resist or the like by the use of the apparatus.

BACKGROUND OF THE INVENTION

A thin film transistor (TFT) formed by the use of a thin film on an insulating surface is widely applied to an integrated circuit and the like and is used as a switching device in many cases. A display panel using the TFT has been widely used especially for a large size display device and hence there has been a growing demand for the higher definition, higher aperture ratio, higher reliability, and upsizing of a screen size.

Among methods for making a wiring in a thin film transistor like this is a method for forming a film of a conductive layer on the whole area of a substrate and then etching the film by using a mask (see patent document 1).

[Patent Document 1] JP-A-2002-359246

In the case of forming a wiring in the manner described in the patent document 1, taking an ICP (Inductively Coupled Plasma) etching unit as an example, there are cases where in accordance with etching conditions such as bias power flux density, ICP power flux density, pressure, the total flow rate of an etching gas, the rate of addition of oxygen, and the temperature of a lower electrode, a selective ratio between a resist and a conductive layer is varied to vary the width and length of the conductive layer in the substrate. Further, in the case of performing an etching process, a step of making a mask by the use of a photoresist or the like is required to elongate a process. Still further, since the conductive layer is once formed over the whole area and then is etched in such a way as to form a desired shape, wasted material is generated. These problems become more serious in the case of forming a wiring on a large size substrate having a side exceeding at least 1 m.

In contrast to this, recently, a start has already been made at studying a method for patterning a substrate directly by a liquid drop discharge method capable of forming a predetermined pattern by discharging a liquid drop containing a composition from a small hole. In this regard, a method for forming a wiring or an electrode pattern directly on a substrate with a material, in which, for example, ultra-fine metal particles are suspended in a solution, and the like have been studied. Further, in place of patterning by the use of a mask just as a conventional photolithography method, a method for forming a pattern directly by the use of a resist by a liquid drop discharge method has been also studied.

However, in the case of discharging these liquid drops by the liquid drop discharge method, a small fluctuation in a direction of discharge of the liquid drop causes a large error in the position where the liquid drop adheres. For this reason, even if the amount of discharge of the liquid drop itself is reduced, a limit is brought to the accuracy of the pattern. Moreover, if the amount of liquid drops is reduced excessively, there is presented not only a problem of reducing throughput but also a problem of reducing also the very accuracy of adhesion of the liquid drop reversely.

In the case of drawing a pattern directly by discharging the liquid drops by the liquid drop discharge method, factors causing a drawing error include an error in adhesion position caused by a small fluctuation in the direction of discharge of the liquid drop, an error caused by the resistance of air while the liquid drop is flying, and an error caused by the movement or spread of the liquid drop after adhesion. As to the first two errors, even if the manufacturing accuracy of the head is improved as much as possible, it is impossible in principle to obtain accuracy higher than probability fluctuation. In FIG. 6 is shown an error caused when a liquid drop discharged from the head adheres to the surface of a substrate. Here, it is assumed that the distance between the head and the surface of the substrate is 500 μm. Assuming that the error angle of a liquid drop discharged from the nozzle is $\theta$, an error of adhesion position caused by this is expressed by about $\pm 500\ \mu m \times \theta$. Hence, even if $\theta$ is as extremely small as $1°$, the error of position becomes as large as $\pm 8.7\ \mu m$. In addition, to this error are added an error caused by fluctuation in air flow and the like and an error caused by the spread and movement of the liquid drop after adhesion.

These problems have narrowed the application range of direct patterning by the liquid drop discharge method.

The invention has been made in view of these problems and drastically improves the accuracy of adhesion position of the liquid drop discharged by the liquid drop discharge method, thereby making it possible to form a fine and highly accurate pattern directly on a substrate. Therefore, one object of the invention is to provide a method for manufacturing a wiring, a conductive layer and a display device that can respond to upsizing of a substrate. Moreover, another object of the invention is to provide a method for manufacturing a wiring, a conductive layer and a display device that can improve throughput and the efficiency of use of material.

SUMMARY OF THE INVENTION

To solve the above-described problems of the conventional technology, the invention takes the following measures.

The invention can improve the accuracy of adhesion position of a liquid drop drastically at the time of patterning a resist material, a wiring material, or the like directly by a liquid drop discharge method mainly on a substrate having an insulating surface. To be specific, the invention is characterized in that: a liquid adhesion position on the surface of the substrate is scanned with a charged beam in accordance with a desired pattern immediately before a liquid drop is discharged by the liquid drop discharge method; and immediately thereafter, the liquid drop is charged with an electric charge of a polarity opposite to the charged beam and is discharged to improve the controllability of the adhesion position of the liquid drop to a great extent.

The invention is characterized in that there are provided means for discharging a liquid drop on a substrate, means for irradiating the surface of the substrate with a charged beam, and means for charging the liquid drop discharged from the means for discharging a liquid drop with an electric charge of a polarity opposite to the charged beam.

The invention is characterized in that there are provided means for discharging a liquid drop on a substrate, means for irradiating the surface of the substrate with a charged beam, means for charging the liquid drop discharged from the means for discharging a liquid drop with an electric charge of a polarity opposite to the charged beam, and a vacuum exhaust means.

Further, the invention is characterized in that a desired portion of a substrate having an insulating film is irradiated with a charged beam before a liquid drop is discharged to the substrate by a liquid drop discharge method and in that the liquid drop discharged by the liquid drop discharge method is charged with an electric charge of a polarity opposite to the charged beam.

In the above construction, the charged beam is an electron beam or an ion beam.

In the invention, a direct patterning by the liquid drop discharge method is performed under reduced pressure.

In the invention, the liquid drop discharged by the liquid drop discharge method contains fine metal particles.

In the invention, the liquid drop discharged by the liquid drop discharge method includes a solution containing a resist material.

In the invention, the liquid drop discharged by the liquid drop discharge method includes a solution containing a silicon compound.

As shown in FIG. 11, in the invention, the adhesion position of the liquid drop can be forcibly aligned by an electromagnetic action. Further, the charged beam is applied usually in a vacuum. Hence, in a case where the liquid drop is discharged in a vacuum, the very resistance that the liquid drop undergoes from air when it is flying does not present a problem. In this manner, the invention can solve the problem described above.

As to the charged beam, it is an electron beam that is most commonly used. This is because the electron beam can be generated with comparative ease and can be collected and scanned easily. In the invention, in addition to the electron beam, for example, an ion beam can be used. These charged beams can have their beam diameters narrowed down electrically and hence can respond to a fine pattern. As to their charged beam sources, the beam source itself may be movable or the beam may be applied to a desired position by scanning the beam itself.

Since the electric charges irradiated needs to be held locally on the surface of the substrate, basically, it is desirable that the surface is covered with an insulating film. In this case, the whole surface is not necessarily covered with the insulating film but it is sufficient for a region required to be patterned to be covered with the insulating film. On the other hand, in the case of forming a pattern also on a surface having a conductive layer partially exposed, the invention does not have an effect on the portion. This is because the conductive body is not charged with the charged beam and hence can not produce an effect of aligning the liquid drops forcibly. In this case, it is required only that the conductive layer is arranged efficiently in the general layout. Hence, it is clear that this does not reduce the effect of the invention itself.

Another means provided by the invention is to change the physical and/or chemical state of the surface with the charged beam. With this, the adhesion position of the liquid drop discharged from the nozzle can be aligned. This will be described below in a more concrete manner by the use of FIG. 11. A surface is made lyophobic in advance and then a portion irradiated with the charged beam is made lyophilic. The liquid drop remains stably at the lyophilic portion. As a result, the liquid drops are arranged at the portions irradiated with the charged beam. Conversely, it is also recommendable to make the initial state lyophilic and to make the portions irradiated with the beam lyophobic. This change in the state of the surface is effected by promoting the chemical reaction of the surface by the energy of the beam. In addition to this, the state of the surface can be changed by depositing beam constituent atoms in an extremely thin manner on the surface by the use of an ion beam.

Further, in the invention, it is also effective that the liquid drops are discharged to the substrate from the head to form a pattern and that the pattern is then pressed, for example, by rollers to shape up the pattern. In this case, when the liquid drops are processed before they are subjected to heat treatment, which will be described below, they can be easily shaped and hence a shaping effect can be usually increased. However, depending on the material, it is also recommendable to subject them to the heat treatment and then to press them.

The main object of the heat treatment described above is to remove quickly unnecessary solvent and the like in the composition that is discharged from the head and adheres to the substrate and to ensure desired material characteristics. For example, in the case of a nano metal particle composition in which ultra-fine metal particles (nano particles) are suspended in a solvent by a surface active substance, in order to reduce the resistance of a metal thin film to be produced to a sufficient extent, it is indispensable to remove the solvent or the surface active substance sufficiently. This requires a temperature higher than a certain degree, for example, annealing at 200° C. or more. Further, in order to enhance the adhesion of the metal particles in the film and to produce a metal film of higher quality, a higher temperature is required.

The heat treatment holds true not only for the nano metal particles but also, for example, an organic resist material. To perform the heat treatment, it is recommendable to use a lamp annealing unit for heating a substrate directly at a high heating rate by using a lamp such as halogen lamp as a heating source or a laser irradiation unit for irradiating laser light. Both units can subject only a desired portion to the heat treatment by scanning the heating source. As to the other methods, it is also recommendable to use a furnace annealing furnace set at a predetermined temperature, an oven held at 100° C. to 300° C., and the like.

As described above, the invention for forming the conductive layer by the liquid drop discharge method can manufacture the conductive layer continuously, for example, without exposing the pixel electrode, light emitting layer, and opposite electrode of a light emitting device to the atmosphere if the composition discharged from the head is changed or the head filled with the composition is changed.

Further, the invention using the liquid discharge method holds superiority in excellently uniform film thickness and the like over a screen printing method in which a solution is applied to a substrate by the use of a printing roll and a letterpress plate having a printing pattern engraved and then is baked to form a thin film (typically, light emitting layer).

Still further, the invention is characterized in that the processing is performed in a vacuum because a charged beam such as an electron beam is used. "In a vacuum" means under reduced pressure sufficiently lower than atmospheric pressure. It is recommendable to reduce pressure to 1 Pa or less, preferably, $1\times10^{-2}$ Pa or less, further preferably, a higher vacuum of $1\times10^{-4}$ Pa or less. Performing the processing in a vacuum makes it possible to irradiate the charged beam with stability and to prevent the flying liquid drops from colliding with and being stirred by gas flow or gas molecules, the effect of the so-called Brownian motion. On the other hand, the solvent always volatilizes from the liquid drop and the liquid drop decreases in volume until the liquid drop reaches the surface of the substrate, so that the time required to perform a heating process thereafter can be shortened.

Incidentally, it is also recommendable to use the invention for the purpose of repairing the impaired electric connection between a wiring and an electrode portion. In this case, it is also possible, for example, to input a portion to be repaired to a personal computer and to discharge a composition having a conductive material from the head to the portion.

The invention having the construction described above can form a highly fine pattern such as wiring and resist directly with ease without using a conventional photolithography process for a large size substrate having a side exceeding at least 1 m. Moreover, since it is required to apply only a necessary amount of material to a desired portion, the amount of wasted material can be made small, which realizes an improvement in the efficiency of use of the material and a reduction in manufacturing cost.

Further, since a mask is not required, processes of exposure, development, and the like can be reduced to a great extent. Still further, by changing the composition to be discharged from the head or by changing the head filled with the composition, a plurality of thin films such as the light emitting layer and electrode of the light emitting device can be continuously manufactured. As a result, throughput can be increased and productivity can be enhanced. Still further, since a mask for the purpose of exposure is not required, for example, a circuit wiring inputted to a personal computer can be manufactured immediately.

The invention having the construction described above can form a wiring and a conductive layer with ease for a large size substrate having a side exceeding at least 1 m. Further, since it is required to apply only a necessary amount of material to a desired portion, the amount of waste material can be made small, which realizes an improvement in the efficiency of use of the material and a reduction in manufacturing cost.

Further, since a mask is not required, processes of exposure, development, and the like can be reduced to a great extent. Still further, by changing the composition to be discharged from the head or by changing the head filled with the composition, a plurality of thin films such as the light emitting layer and electrode of the light emitting device can be continuously manufactured. As a result, throughput can be increased and productivity can be enhanced. Still further, since a mask for the purpose of exposure is not required, for example, a circuit wiring inputted to a personal computer can be manufactured immediately. From these viewpoints, the invention has advantages in an apparatus mechanism, the efficiency of use of material, and the like over a screen printing.

Still further, in addition to the above points, the conventional liquid drop discharge method has a drawback of a low degree of accuracy, but the invention can improve the degree of accuracy to a great extent. In the conventional printing methods including the liquid drop discharge method, it is difficult to make the accuracy of a pattern 10 μm or less. However, the invention can improve the accuracy to 1 μm or less. Therefore, the invention can provide a high-definition display device.

DETAILED DESCRIPTION OF THE PRESENTLY PREFERRED EMBODIMENTS

The preferred embodiments of the present invention will be described in detail by the use of FIG. 1. However, the invention is not limited to the following descriptions but modifications and variations may be made in the embodiments and details without departing from the spirit and scope of the invention, as those skilled in the art will readily understand. Therefore, the invention will not be interpreted limitedly in the descriptions of the preferred embodiments shown below. Here, in accordance with the invention, a liquid drop discharge apparatus will be described that has a vacuum exhaust means and an electron beam irradiation means, that is, an electron gun and uses a liquid drop discharge method.

Figure 1:
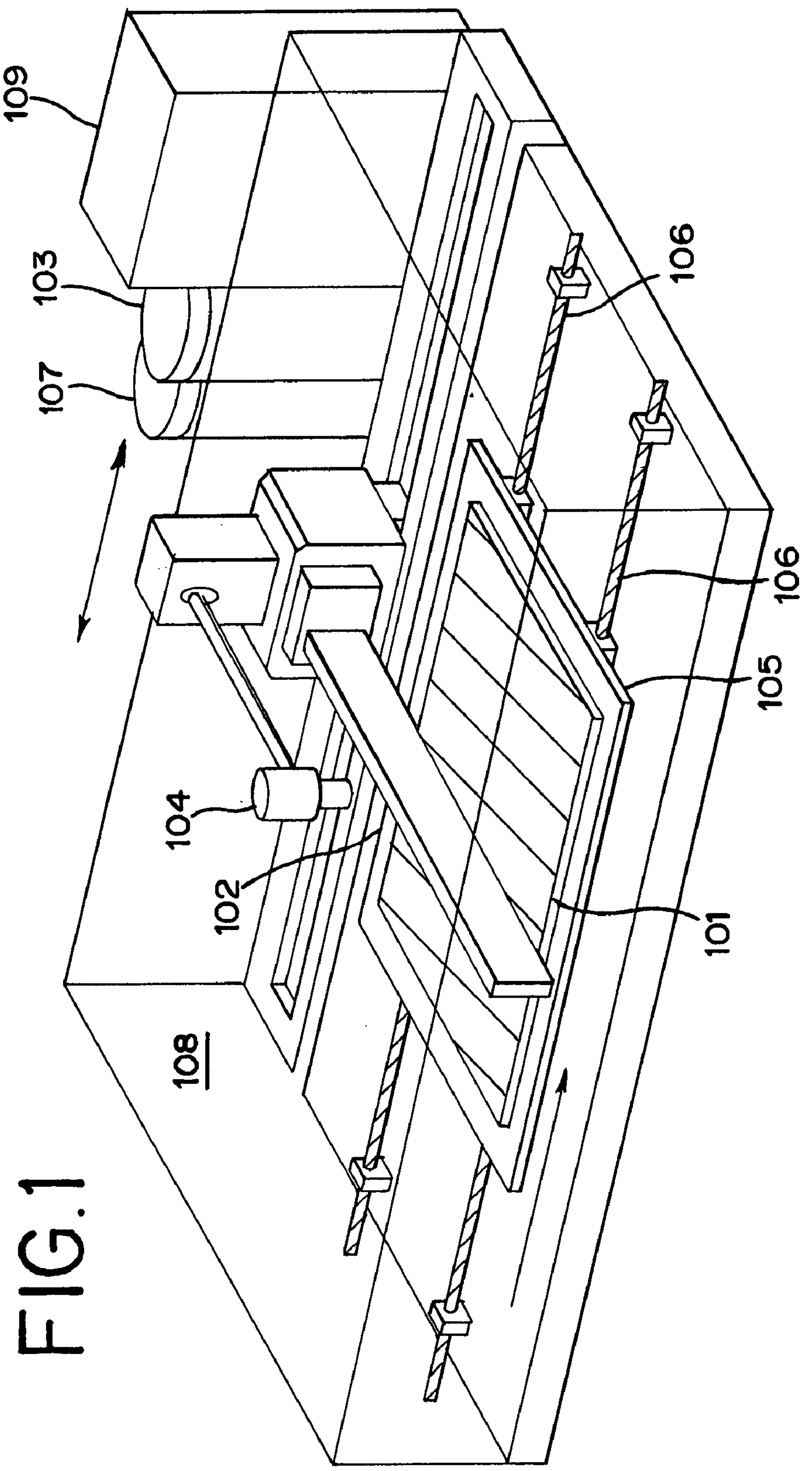
FIG. 1 is a perspective view to show a manufacturing method of the present invention.

In FIG. 1, the whole of the apparatus is constructed of means 106 for fixing a substrate 101 by a technique of a mechanical chuck or the like and moving it in the direction of a Y axis with precision, means 107 for supplying a head 102 with a composition, vacuum exhaust means 103 for exhausting a processing chamber to a vacuum, means (for example, electron gun) 104 for generating an electron beam and applying it to a desired position, and the like.

First, the vacuum exhaust means 103 can exhaust the chamber and keep it in a high degree of vacuum. Further, in the chamber, the head 102 is means for discharging fine liquid drops containing material for forming a desired pattern on the substrate 101 and includes many nozzles and can move in the direction of an X axis and can be finely adjusted in position. On the other hand, the substrate 101 can move in the direction of the Y axis and various patterns can be formed on the substrate by adjusting the period of discharge of the liquid drops from the head 102, the travel distance of the substrate 101, and the position of the head 102 in fine increments at the same time in such a way that a continuous wiring pattern can be formed on the substrate. Here, the electron gun 104 is arranged adjacently to the head 102. The electron gun 104 has an electron lens built-in and can collect a beam and scan the beam at the same time. In this case, the beam is scanned in the direction of the X axis.

In addition, transfer means for loading or unloading a substrate to be processed from or to means 105 for holding the substrate and a cleaning unit that sends clean air to reduce dust in a working area may be provided as accompanying elements.

In the vacuum exhausting means 103, a turbo-molecular pump, a mechanical booster pump, an oil rotary pump, or a cryo-pump can be used as an exhaust pump and it is desirable to use these pumps in appropriate combination.

In the invention, wirings, conductive films and the pattern of a resist material are formed in a liquid drop discharge process chamber 108.

Preferably, the amount of composition discharged at one time from the head 102 is 10 to 70 pl and viscosity is 100 cp or less and a particle size is 0.1 μm or less. This is because of preventing drying and because the composition can not be smoothly discharged from discharge ports when viscosity is too high. The viscosity, surface tension and drying rate of the composition are suitably adjusted in accordance with solvent to be used and use. Preferably, the composition discharged from the head is continuously dropped on the substrate and is formed in the shape of a line or stripes. However, the composition may be dropped at predetermined positions, for example, for each one dot.

The liquid drop discharge process chamber 108 is provided with substrate holding means 105, the head 102, the electron gun 104, and the like. An electron beam is applied in advance to a desired position on the substrate 101 from the electron gun 104 immediately before a liquid drop is discharged from the head 102. With this, a local portion to which the electron beam is applied is charged at a minus electric potential. On the other hand, the head 102 is provided with a mechanism for charging a liquid drop at a plus potential. The positively charged liquid drop adheres to a portion of the substrate that is negatively charged. This can drastically improve the accuracy of adhesion position of the liquid drop. Various methods can be used as a mechanism for charging a liquid drop positively and the simplest method is to keep the head itself at a high electric potential. As to a method for charging a liquid drop, various methods can be suitably selected in accordance with the spirit of the invention.

Up to this point, a mechanism for charging a desired position on a substrate at a minus potential by using an electron beam and then for making a liquid drop charged at a plus potential adhere correctly to the portion charged at a minus potential has been described with reference to the drawing of a typical apparatus, but an effect produced by using a charged beam in accordance with the invention can be produced, for example, by the following example in addition to the mechanism. That is, the surface of the substrate is previously made lyophobic to the liquid drop discharged and then a charged beam, for example, an ion beam of $CH_x^-$ or the like shown in FIG. 11(B) is applied to a desired portion on the substrate to deposit an extremely thin hydrocarbon film charged at a minus potential to make the portion lyophilic. With this, it can be expected that a pattern control is also improved to a great extent not only by controlling a position where the liquid drop adheres but also by preventing the liquid drop from spreading after it adheres. In this case, the ion beam to be used is not limited to $CH_x^-$ but a metal ion such as $Ga^+$ can be used and various kinds of ions can be suitably selected. In a case where ions to be applied are plus ions, it is desirable that the liquid drops to be discharged are charged at a minus potential, which is natural from the spirit from the invention.

On the other hand, in the case of a pattern control by changing the state of the surface by use of the ion beam, even if the liquid drops are not charged, as described above, a large effect can be expected for the position of the liquid drop. Further, the effect of thin film deposition produced by the ion beam is not necessarily expected but it is also possible to expect the effect produced only by local charging. On the contrary, even if the deposition of a thin film is not expected, as is the case with the electron beam, it is possible to enhance the effect more by changing the lyophilic state or the lyophobic state of the surface of the substrate.

As to an apparatus in this embodiment, although not shown in FIG. 1, it is also recommended that there be provided, if necessary, a sensor for positioning to the substrate 101 and to a pattern on the substrate, means for introducing gas into the liquid drop discharge process chamber 108, means for exhausting the liquid drop discharge process chamber 108, means for heating the substrate, means for applying light to the substrate, and means for measuring various physical values such as temperature and pressure. Further, these means can be also controlled in a collective manner by control means 109 provided outside a case. Still further, if the control means 109 is connected to a production management system or the like through a LAN cable, a wireless LAN, or an optical fiber cable, the process can be controlled across the board from the outside, which leads to improving productivity.

As described above, in the invention, the means of the embodiment described above can be variously and freely applied for use in combination.

Further, as to material to be discharged for use, any material can be used if it can be dissolved in a solvent or can be converted to a liquid when it is heated and can be discharged as liquid drops, for example, a conductive material to become a wiring, a resist material, a resin material to become an orientation film, a light emitting material used for a light emitting device, an etching liquid used for wet etching can be used in accordance with uses.

On the other hand, as to a substrate used in the invention, in addition to a glass substrate of a desired size, a resin substrate typified by a plastic substrate or a processed substance of a semiconductor wafer typified by silicon can be used. Further, either a substrate having a flat surface or a substrate having an uneven pattern formed thereon can be used. Still further, as to the lyophilic surface and the lyophobic surface of the substrate, as described above, either of them can be suitably selected in the application range or is not necessarily required.

Embodiments

Embodiment 1

The first embodiment of the invention will be described in detail by the use of FIGS. 2 and 3. In the invention, an active matrix type liquid crystal display device is made by a patterning process using a liquid drop discharge method without using a patterning process using a conventional photolithography. In the construction of the invention to be described below, reference symbols designating the same parts are used in common throughout the different drawings. Here, a process for manufacturing an N channel type TFT (for switch) and a capacitance on the same substrate will be described.

Figure 2A:
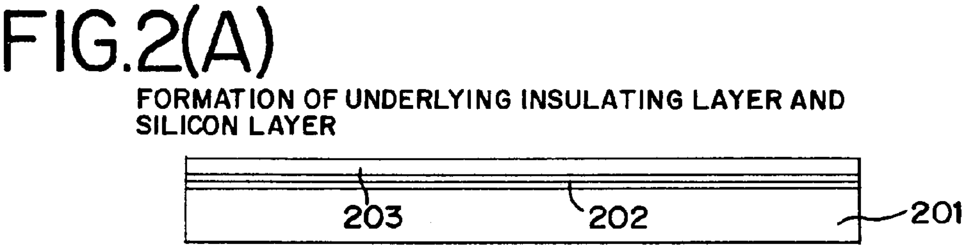
FIGS. 2(A)–2(D) are sectional views to show the manufacturing method of the invention.
Figure 2B:
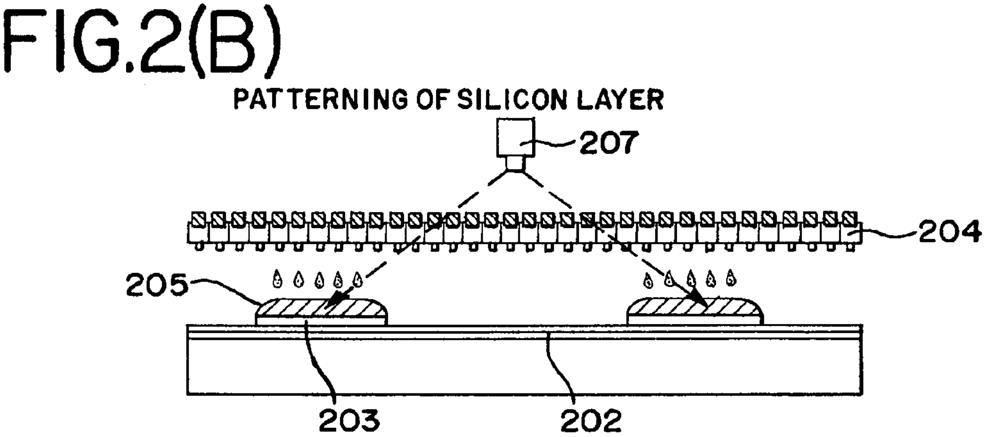

A substrate resistant to the processing temperature of this process such as a glass substrate and a flexible substrate typified by a plastic substrate is used as the substrate 201 (FIG. 2(A)). To be specific, an active matrix substrate is manufactured by the use of the substrate 201 having transparence. As to a substrate size, it is preferable that a large area substrate such as 600 mm×720 mm, 680 mm×880 mm, 1000 mm×1200 mm, 1100 mm×1250 mm, 1150 mm×1300 mm, 1500 mm×1800 mm, 1800 mm×2000 mm, 2000 mm×2100 mm, 2200 mm×2600 mm, or 2600 mm×3100 mm is used to reduce manufacturing cost. As a usable substrate can be used a glass substrate such as barium borosilicate glass and alumino borosilicate glass typified by #7059 glass and #1737 glass made by Corning Corporation. Further, a transparent substrate such as a quartz substrate and a plastic substrate can be also used as another substrate.

In this embodiment, the glass substrate 201 was used. Next, an underlying film 202 made of an insulating film was formed over the substrate 201. The underlying film 202 may be either a single layer or a laminated structure. In this embodiment, the underlying film 202 was a two-layer structure. By the use of a sputtering method, a silicon nitride oxide film was formed as the first layer in a thickness of 50 nm and a silicon oxide nitride film was formed as the second layer in a thickness of 50 nm and then its surface was planarized by a CMP method or the like (FIG. 2(A)).

Next, a semiconductor layer 203 is formed over the underlying film 202. As to the semiconductor layer 203, first, a semiconductor film is formed in a thickness of 25 nm to 80 nm by a publicly known method (sputtering method, LPCVD method, plasma CVD method or the like). Next, the semiconductor film is crystallized by a publicly known crystallization method (laser crystallization method, thermal crystallization method using RTA or furnace annealing furnace, or thermal crystallization method using a metal element for promoting crystallization). Here, as the semiconductor film may be used an amorphous semiconductor film, a fine crystalline semiconductor film, a crystalline semiconductor film, or a compound semiconductor film having an amorphous structure such as an amorphous silicon germanium film.

In this embodiment, an amorphous silicon film of 50 nm in film thickness was formed by the plasma CVD. Thereafter, a solution containing nickel was held on the amorphous silicon film to dehydrogenate this amorphous silicon film (500° C., 1 hour) and then the amorphous silicon film was thermally crystallized (550° C., 4 hour) to form a crystalline silicon film. Thereafter, by a liquid drop discharge method in accordance with the invention, the crystalline silicon film was patterned by a resist 205 discharged from the head 204 while it was being irradiated with an electron beam from the electron gun 207. Further, an insular semiconductor layer 203 was formed by a dry etching method by using the resist pattern as a mask (FIG. 2(B)). In this embodiment, all the patterns were irradiated with the electron beam but it is also effective from the viewpoint of improving throughput to irradiate necessary patterns with the electron beam. In particular, it is also effective to irradiate a portion of a high pattern density or a portion of a fine pattern selectively with the electron beam.

In this regard, as a laser in a case where a crystalline semiconductor film is manufactured by the laser crystallization method can be used a gas laser or a solid laser of a continuous oscillation or a pulse oscillation. The former gas laser includes an excimer laser and a YAG laser and the latter solid laser includes a laser using a crystal of YAG or $YVO_4$ doped with Cr and Nd. Here, to obtain a crystal having a large grain size at the time of crystallizing the amorphous semiconductor film, it is preferable that a solid laser capable of oscillating continuously is used and that the second to the fourth harmonics of a fundamental are used. In the case of using the above laser, it is recommended that a laser beam emitted from a laser oscillator be collected in the shape of a line by an optical system and be applied to the semiconductor film.

However, in this embodiment, the amorphous silicon film was crystallized by the use of a metal element for promoting crystallization and hence the metal element remains in the crystalline silicon film. For this reason, an amorphous silicon film of 50 to 100 nm in thickness is formed over the crystalline silicon film and then is subjected to heat treatment (RTA method, thermal annealing using a furnace annealing furnace, or the like) to diffuse the metal element in the amorphous silicon film and then the amorphous silicon film is removed by etching after the heat treatment. As a result, the metal element in the crystalline silicon film can be reduced in content or removed. Further, it is also recommended that a small amount of impurity element (boron) be doped (channel doped) to control the threshold of a TFT after the semiconductor layer 203 is formed.

Next, agate insulating film 206 to cover the semiconductor layer 203 is formed. The gate insulating film 206 is formed of an insulating film containing silicon in a film thickness of 40 to 150 nm by the use of the plasma CVD method or the sputtering method. In this embodiment, a silicon oxide nitride film was formed as the gate insulating film 206 in a thickness of 115 nm by the plasma CVD method.

Figure 2C:
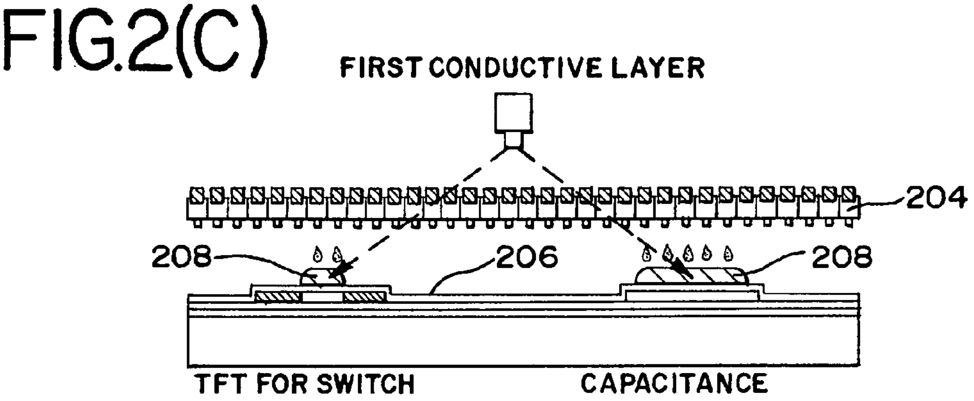
Figure 2D:
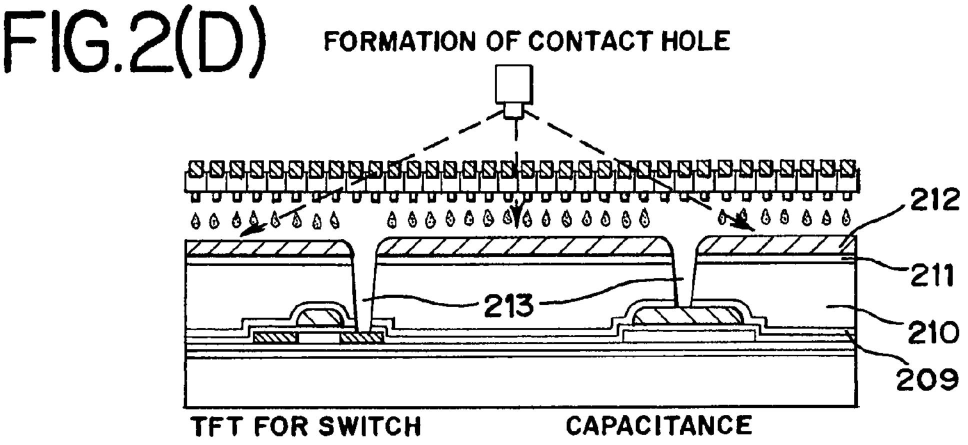

Further, similarly, the first conductive layer (gate wiring, gate electrode, capacitor electrode) 208 is formed under reduced pressure or in a vacuum by the irradiation with the electron beam and the liquid drop discharge method (FIG. 2(C)). In this embodiment, a liquid in which nano fine particles of Al were diffused in an organic solvent by the use of a surface active agent was discharged to form a gate pattern. In particular, since a gate electrode pattern has a large effect on transistor characteristics, the concurrent use of irradiation with the electron beam is effective in the improvement of the performance of an active matrix type display. As described above, the electron beam was used for all the patterns in this embodiment, but it is also effective to use the electron beam, for example, only for the gate electrode on a particularly important Si pattern. On the other hand, if the amount of irradiation and irradiation energy of the electron beam to the gate insulating film 206 are too large, the gate insulating film 206 is damaged. Hence, naturally, it is desirable that the mount of irradiation and irradiation energy of the electron beam are sufficiently small within a range of producing the effect of the invention.

The electron gun is provided with means for collecting the beam and means capable of scanning the beam to a desired position on the substrate. Further, the liquid drop discharge apparatus has many liquid drop injection nozzles. It is also recommended that a plurality of heads each having a different nozzle diameter be prepared and that a head having a different nozzle diameter be properly used in accordance with use. Here, the nozzle diameter of an ordinary head is 50 to 100 μm and, depending on the nozzle diameter, in consideration of throughput, in order to make it possible to form a pattern by a single scanning, it is also recommended that a plurality of nozzles be arranged in parallel in such a way as to be equal in length to one column or one row of the pattern. Further, it is also recommendable to arrange an arbitrary number of nozzles and to scan at a plurality of times or to scan the same portion at a plurality of times to apply the liquid in layers. Still further, it is preferable to scan the head, but it is also acceptable to move the substrate. To drop the liquid drop at a desired position, it is preferable that the distance between the substrate and the head is as short as possible, to be specific, about 0.1 mm to 2 mm.

Preferably, the amount of composition discharged at one time from the head is from 10 pl to 70 pl and viscosity is 100 cp or less and a particle diameter is 0.1 μm or less. This is because of preventing drying and because the composition can not be smoothly discharged from the discharge port if the viscosity is too high. The viscosity, surface tension, and drying rate of the composition are suitably adjusted in accordance with solvent to be used and use. Further, it is desirable that the composition discharged from the head is continuously dropped on the substrate and is formed in the shape of a line or stripes. However, the composition can be dropped at desired positions, for example, for each one dot.

As the composition to be discharged from the head is used a material in which a conductive material suitably selected from: an element selected from a group consisting of tantalum (Ta), tungsten (W), titanium (Ti), molybdenum (Mo), aluminum (Al), copper (Cu), chromium (Cr), and neodymium (Nd); an alloy material or a compound material whose main component is the element described above; and a AgPdCu alloy is dissolved or diffused in a solvent. As the solvent is used an ester group such as butyl acetate and ethyl acetate, an alcohol group such as isopropyl alcohol and ethyl alcohol, or an organic solvent such as methyl ethyl ketone and acetone. It is recommended that the concentration of the solvent be suitably determined according to the kinds of the conductive materials and the like.

Further, ultra-fine particles (nano metal particles) made by diffusing silver (Ag), gold (Au), or platinum (Pt) in a particle diameter of 10 nm or less may be used as the composition to be discharged from the head. In this manner, when the composition in which particles of a fine particle diameter are diffused or dissolved in the solvent is used, a problem that the nozzle is choked can be solved. In this regard, in the invention using the liquid drop discharge method, the particle diameter of the constituent material of the composition needs to be smaller than the diameter of the nozzle. Further, a conductive polymer (conductive macromolecule) such as polyethylene dioxi-thiophene/polystyrene sulfonic acid (PEDT/PSS) aqueous solution can be used.

Moreover, the use of a low-resistance metal such as silver and copper as a wiring material can reduce the resistance of the wiring and hence is preferable in the case of using a large substrate. In addition, it is difficult to work these metal materials by a usual dry etching method and hence it is extremely effective to pattern them directly by the liquid drop discharge method. However, for example, in the case of copper or the like, to prevent a detrimental effect on the electric characteristics of a transistor, it is preferable to provide a conductive film as a barrier to prevent diffusion. By the conductive film as a barrier, it is possible to form a wiring without copper being diffused in the semiconductor provided in the transistor. As the conductive film as a barrier can be used a film made of one element selected from a group of consisting of tantalum nitride (TaN), titanium nitride (TiN), and tungsten nitride (WN) or laminated films made of a plurality of elements selected from the group. Further, since copper tends to be oxidized, it is preferable to use copper in combination with an oxidation inhibitor.

Thereafter, the substrate having the first conductive layer formed thereon is subjected to heat treatment under ordinary pressure or reduced pressure or in a vacuum within the range from 150° C. to 300° C. to volatilize the solvent to enhance the density of the composition to reduce resistance. However, as to the solvent in the composition discharged from the head 204, a solvent that volatilizes after the composition drops on the substrate is suitably used. A case like this embodiment where the liquid drop is discharged in a vacuum is characterized in that a volatilizing rate is larger as compared with a usual case where the liquid drop is discharged under atmospheric pressure. In particular, when a highly volatile solvent such as toluene is used, the solvent volatilizes instantaneously after the composition drops on the substrate. In such a case, a process of heat treatment can be omitted. However, the solvent of the composition is not limited to a special one but, even in a case where a solvent is used that volatilizes after the composition drops, the composition may be subjected to the heat treatment to have the density thereof enhanced to have a desired resistance. Further, this heat treatment may be performed every time the thin film is formed by the liquid drop discharge method or may be performed for each arbitrary process or may be performed by one operation after all the processes are finished.

The heat treatment is performed by the use of a lamp annealing unit for heating a substrate directly at a high heating rate by using a lamp such as halogen lamp as a heating source or a laser irradiation unit for irradiating laser light. Both units can subject only a desired portion to the heat treatment by scanning the heating source. A furnace annealing set at a desired temperature may be also used as another method. However, in the case of using a lamp, it is preferable to use light having a wavelength that does not break the composition of the thin film to be subjected to the heat treatment but can only heat it, for example, light having a wavelength longer than 400 nm, that is, light having a wavelength longer than infrared ray. It is preferable to use far-infrared ray (typical wavelength is 4 μm to 25 μm) from the viewpoint of easy handling. Further, in the case of using laser light, it is preferable that a beam spot on the substrate of the laser light emitted from a laser oscillation unit is formed in the shape of a line in such a way as to be equal in length to the length of the column or the row of the pattern. With this, it is possible to finish laser irradiation by one scanning. In this embodiment, a usual furnace annealing was used as the heat treatment.

Next, a doping process of doping an impurity element for making the semiconductor layer 203 an N type or a P type by using the gate electrode 208 as a mask. In this embodiment, an impurity element for making the semiconductor layer 203 an N type was added to the semiconductor layer 203 to form an impurity region. At the same time, a region (generally referred to as a channel forming region) was formed to which the impurity element was never added or a small amount of impurity element was added.

Thereafter, the first interlayer insulating film 209 to cover the whole area is once formed. The first interlayer insulating film 209 is formed of an insulating film containing silicon and having a film thickness of 40 nm to 150 nm by the plasma CVD method or the sputtering method. In this embodiment, a silicon nitride film was formed as a gate insulating film 206 in a thickness of 100 nm by the plasma CVD method. Further, similarly, the second interlayer insulating film 210 to cover the whole area is formed. A silicon oxide film formed by the CVD method, a silicon oxide film coated by a SOG (Spin On Glass) method) or a spin coat method, an organic insulating film made of acrylic or the like, or an non-photosensitive organic insulating film is formed as the second interlayer insulating film 210 in a thickness of 0.7 to 5 μm. In this embodiment, an acrylic film 50 having a film thickness of 1.6 μm was formed by a coating method. In this respect, the second insulating film 210 has a strong sense of smoothing the unevenness caused by the TFT formed on the substrate 201 and planarizing its surface and hence, preferably, is a film excellent in planarizing the surface. Further, a silicon nitride film to become the third interlayer insulating film 211 is formed in a thickness of 0.1 μm.

Thereafter, as is the case described above, a resist pattern 212 for forming a contact hole 213 was formed by the combined use of electron beam irradiation and liquid drop discharge. Next, the contact hole 213 was formed by using the resist pattern 212 as a mask by an anisotropic dry etching method (FIG. 2(D)).

Figure 3A:
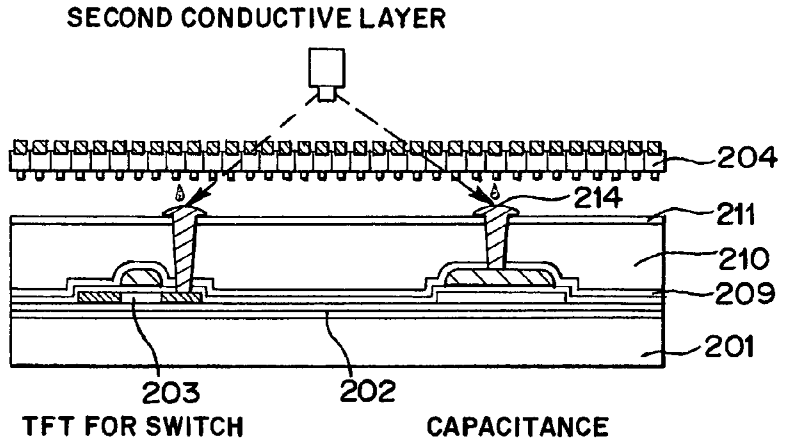
FIGS. 3(A)–3(C) are sectional views to show the manufacturing method of the invention.

Thereafter, after the resist pattern 212 is removed, the second conductive layer (source wiring and drain wiring) 214 is formed in such a way as to extend to the bottom of the contact hole 213 similarly by the combined use of electron beam irradiation and liquid drop discharge. In this embodiment, a liquid in which nano fine silver particles were diffused in an organic solvent by the use of a surface active agent was used as the composition to be discharged. A sectional view at this time is shown in FIG. 3(A).

In this case, a source or a drain region on a gate electrode pattern formed of Al or a Si pattern is exposed to the bottom portion of the contact hole. Since these regions are conductive, even if they are irradiated with the electron beam, they are not charged. However, since the outer periphery of the contact hole is charged, a sufficient effect can be produced. Further, since it is necessary to provide the liquid drop sufficiently in the contact hole, more liquid drops need to be dropped in the contact hole. Alternatively, it is also important from the viewpoint of preventing an impaired contact resistance to increase the amount of coating at this portion by coating in layers. In this regard, in the case of forming the second conductive layer, it is necessary to set the viscosity of the composition to be discharged at an optimum value.

Next, the heat treatment is performed. By the processes up to this point, a transistor could be formed on the substrate 201 having an insulating surface.

Figure 3B:
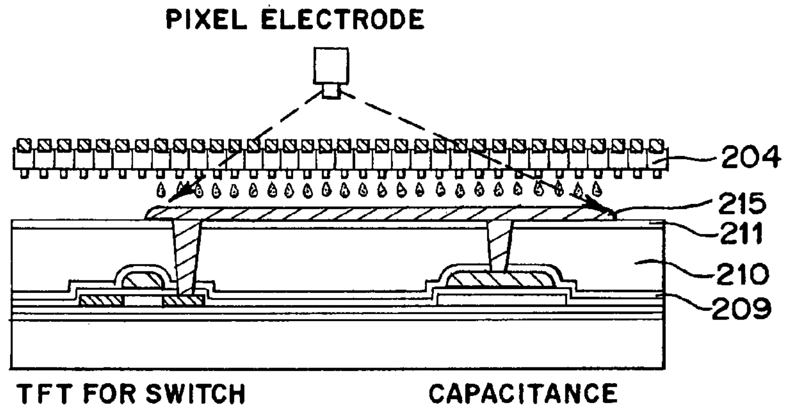
Figure 3C:
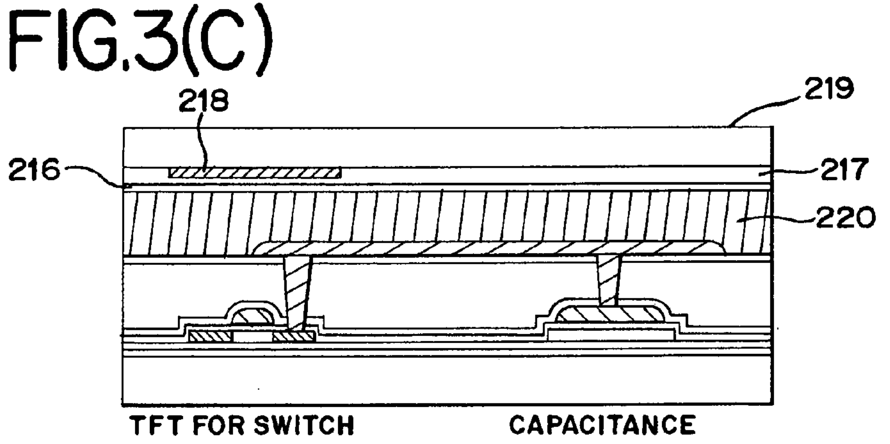

Next, a pixel electrode 215 made of a transparent conductive material is formed over the whole area in such a way as to be electrically connected to the second conductive layer 214 (FIG. 3(B)). The pixel electrode 215 is formed of, for example, a compound (ITO) of indium oxide and tin oxide, a compound of indium oxide and zinc oxide, zinc oxide, tin oxide, indium oxide, and titanium nitride. In this embodiment, an ITO film was formed as the pixel electrode 215 in a thickness of 0.1 μm by a method of using electron beam irradiation and liquid drop discharge in combination (FIG. 3(B)).

In the manner described above, an active matrix substrate constructed of a source wiring in a pixel portion, a TFT and a holding capacitance in the pixel portion, and a terminal portion can be manufactured. The active matrix substrate or an opposite substrate is divided in a desired shape, if necessary.

Thereafter, the active matrix substrate is bonded to an opposite substrate 219 having a common electrode 216, a color filter 217, a black matrix 218 and the like formed thereon. A liquid crystal 220 is poured between them by a predetermined method to complete a liquid crystal display device (FIG. 3(C)).

Figure 11A:
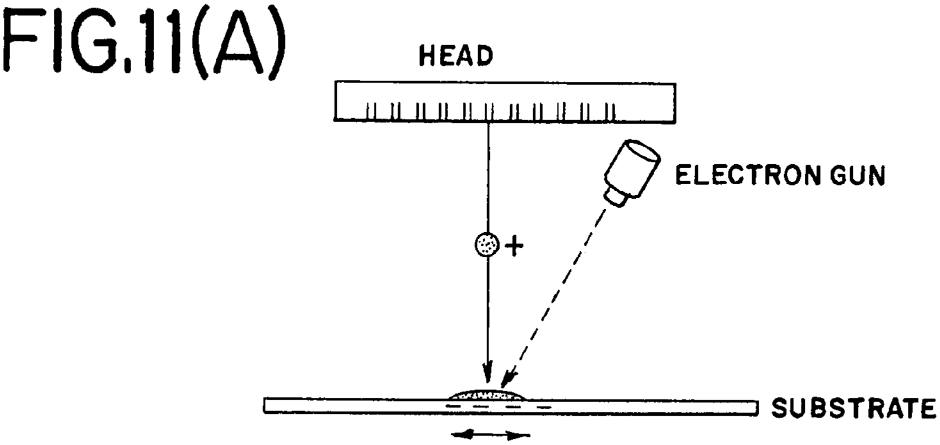
FIGS. 11(A)–11(B) are sectional views to show the manufacturing method of the invention.
Figure 11B:
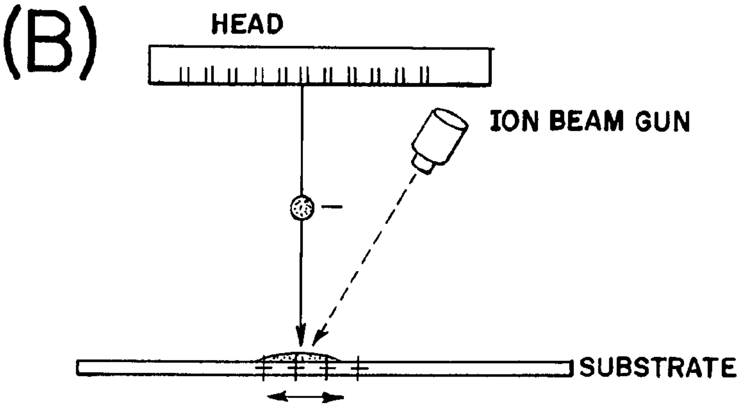

A liquid crystal module produced by the above processes is provided with a backlight and a light guiding plate and is covered with a cover to complete an active matrix type liquid crystal display device (transparent type) the sectional view of which is partially shown in FIG. 11. Here, the cover is fixed to the liquid crystal module by the use of an adhesive or an organic resin. Further, since this is a transparent type, polarizing plates are bonded to both of the active matrix substrate and the opposite substrate.

Further, while the transparent display device has been shown by way of example in this embodiment, it is not intended to limit a display device to the transparent type display but a reflective type or a translucent type liquid crystal display device can be also manufactured. In the case of manufacturing the reflective type liquid crystal display device, it is recommendable to use a metal film having a high optical reflection factor, typically, a material film whose main component is aluminum or silver or a laminated film made of the same, as the pixel electrode.

Up to this point, the first embodiment of the invention has been described by taking the active matrix type liquid crystal display device as an example. However, it is not intended to limit the invention to this embodiment but the invention can be applied to other embodiments on the basis of the spirit of the invention. For example, as shown in embodiment 2, the invention can be similarly applied also to an active matrix type organic EL display device. In addition, as to the materials and the forming methods described in the embodiment of the invention, they can be also suitably selected for use in accordance with the spirit of the invention.

Embodiment 2

The second embodiment of the invention will be described in detail by the use of FIGS. 4 and 5. Also in this embodiment, an EL display device is manufactured by a patterning process of using electron beam irradiation and liquid drop discharge in combination without using a patterning process of using a conventional lithography method. Incidentally, in the construction of the invention to be described below, the reference symbols designating the same parts are used in common throughout the different drawings. Here, a process of manufacturing an EL display device will be described by which an N channel type TFT (for switch) and two P channel type TFTs (for driving) are formed on the same substrate by the use of the invention. In this regard, the detailed descriptions of the same parts as those in the first embodiment will be omitted.

Figure 4A:
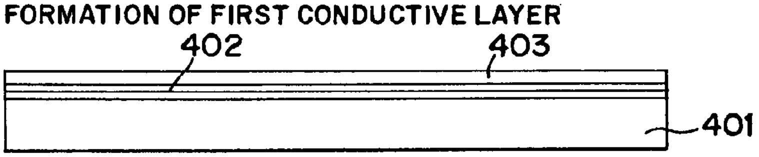
FIGS. 4(A)–4(D) are sectional views to show the manufacturing method of the invention.
Figure 4B:
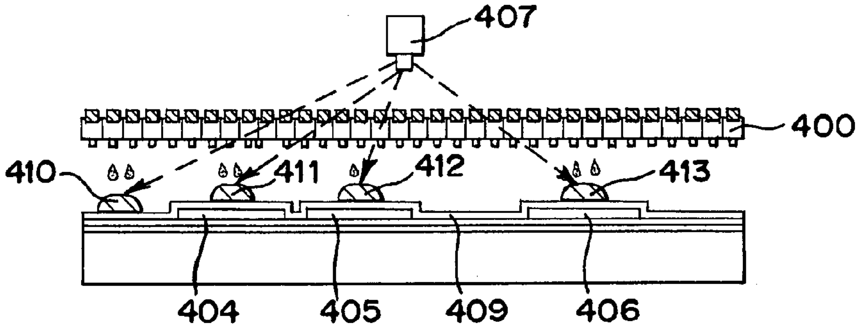
Figure 4C:
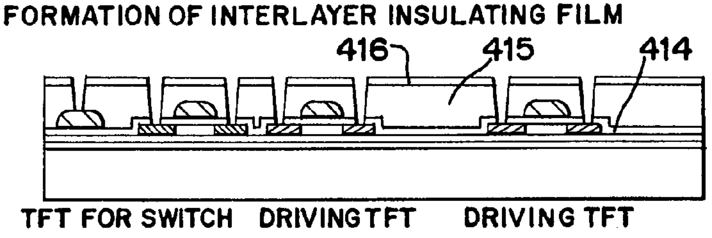

A substrate resistant to a treatment temperature in this process, for example, a glass substrate and a flexible substrate typified by a plastic substrate is used as a substrate 401 (FIG. 4(A)). In this embodiment, a glass substrate 401 was used. Next, an underlying film 402 made of an insulating film is formed over the substrate 401. The underlying film 402 may be a single layer or a laminated structure. In this embodiment, the underlying layer 402 is formed in a two-layer structure of the first layer made of a silicon nitride oxide film having a thickness of 50 nm and the second layer made of a silicon oxide nitride film having a thickness of 50 nm by the sputtering method and then its surface was planarized by the CMP method or the like (FIG. 4(A)).

Next, a semiconductor layer 403 is formed over the underlying film 402. As to the semiconductor layer 403, first, a semiconductor film is formed in a thickness of 25 nm to 80 nm by a publicly known method (sputtering method, LPCVD method, plasma CVD method or the like). Next, the semiconductor film is crystallized by a publicly known crystallization method (laser crystallization method, thermal crystallization method using RTA or furnace annealing furnace, or thermal crystallization method using a metal element to promote crystallization). Here, as the semiconductor film may be used an amorphous semiconductor film, a fine crystalline semiconductor film, a crystalline semiconductor film, or a compound semiconductor film having an amorphous structure such as an amorphous silicon germanium film.

As is the case with the first embodiment, an amorphous silicon film having a film thickness of 50 nm was formed by the plasma CVD. Thereafter, a solution containing nickel was held on the amorphous silicon film to dehydrogenate this amorphous silicon film (500° C., 1 hour) and then the amorphous silicon film was thermally crystallized (550° C., 4 hour) to form a crystalline silicon film. Thereafter, by the combined use of electron beam irradiation and liquid drop discharge, the crystalline silicon film was patterned by a resist discharged from the head 400 while it was being irradiated with an electron beam from an electron gun 407 under reduced pressure or in a vacuum and then was etched by the dry etching method by using the resist pattern as a mask to form the semiconductor layers 404 to 406 (FIG. 4(B)).

Next, a gate insulating film 409 is formed. A silicon oxide nitride film was formed as the gate insulating film 409 in a thickness of 115 nm by the plasma CVD method (FIG. 4(B)).

Next, as is the case with the first embodiment, the first conductive layers (gate wiring, gate electrode) 410 to 413 are formed of a tungsten film under reduced pressure or in a vacuum by the combined use of electron beam irradiation and liquid drop discharge. Thereafter, the first conductive layers are once annealed at about 250° C. to remove impurities of organic solvent and the like (FIG. 4(B)).

Thereafter, the substrate having the first conductive layers formed thereon is subjected to the heat treatment within a range from 150° C. to 300° C. under normal pressure or reduced pressure, or in a vacuum to volatilize the solvent to generate excellent conduction characteristics. However, as to the solvent in the composition to be discharged from the head 400, a solvent is suitably used that volatilizes after the composition drops on the substrate. In particular, when a highly volatile solvent such as toluene is used, the solvent volatilizes after the composition drops on the substrate. In such a case, the heat treatment process can be omitted. However, the solvent of the composition is not limited to a special one but even in a case where a solvent is used that volatilizes after the composition drops, the solvent may be subjected to the heat treatment to have the viscosity thereof reduced to have a desired viscosity. Further, this heat treatment may be performed every time the thin film is formed by the liquid drop discharge method or may be performed for each arbitrary process or may be performed by one operation after all the processes are finished.

Further, a doping process of doping an impurity element for providing the semiconductor layers 404 to 406 with an N type or a P type by using the gate electrodes 411 to 413 as a mask. In this embodiment, an impurity element for providing an N type was added to the semiconductor layer 404 and an impurity element for providing a P type was added to the semiconductor layers 405 and 406, thereby forming impurity regions. At the same time, regions (generally referred to as a channel forming region) were formed to which an impurity element were never added or a small amount of impurity element were added.

Thereafter, the first interlayer insulating film 414 to cover the whole area is once formed. The first interlayer insulating film 414 is formed of an insulating film containing silicon in a film thickness of 40 nm to 150 nm by the plasma CVD method or the sputtering method. In this embodiment, a silicon nitride film was formed as the first interlayer insulating film 414 in a thickness of 100 nm by the plasma CVD method. Further, similarly, the second interlayer insulating film 415 to cover the whole area is formed. An acrylic film was formed as the second interlayer insulating film 415 in a film thickness of 1.6 μm by a coating method. Further, a silicon nitride film to become the third interlayer insulating film 416 is formed in a thickness of 0.1 μm.

Thereafter, a resist pattern for forming a contact hole was formed by the combined use of electron beam irradiation and liquid drop discharge, as is the case described above. Then, the contact hole was formed by the anisotropic dry etching method by using the resist pattern as a mask (FIG. 4(C)).

Figure 4D:
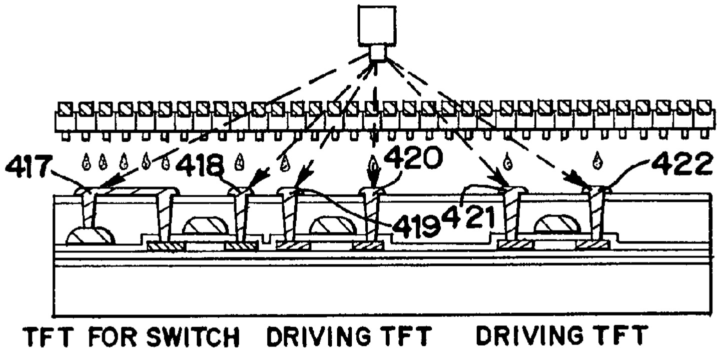
Figure 5A:
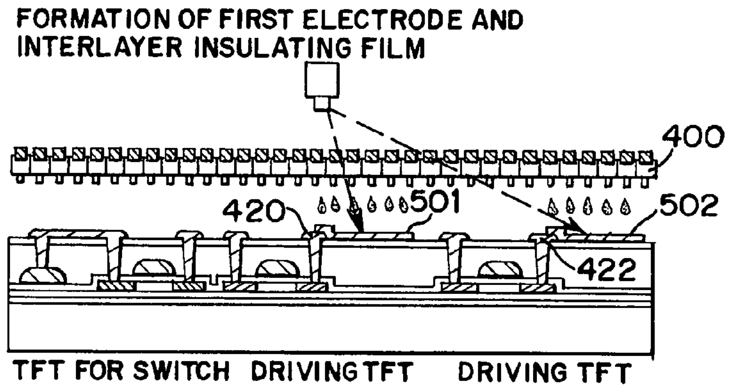
FIGS. 5(A)–5(D) are sectional views to show the manufacturing method of the invention.
Figure 5B:
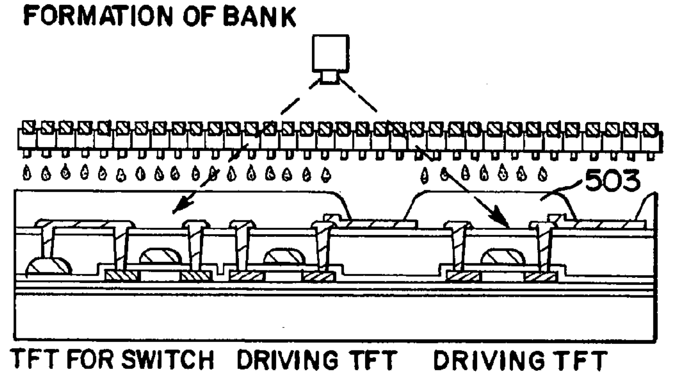
Figure 5C:
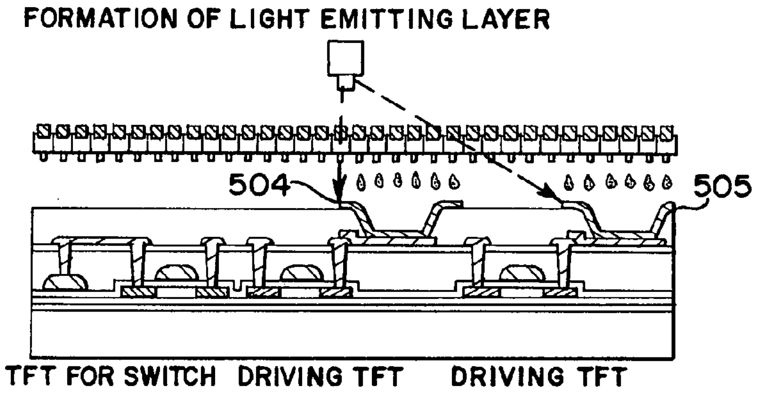
Figure 5D:
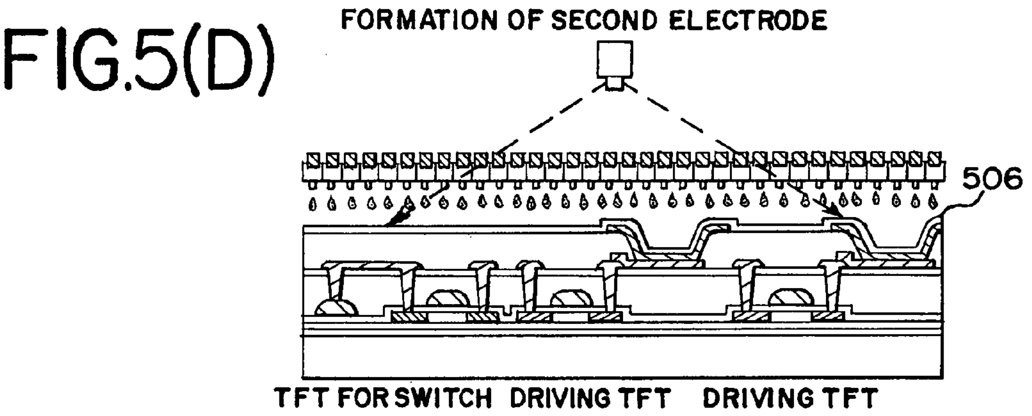
Figure 6:
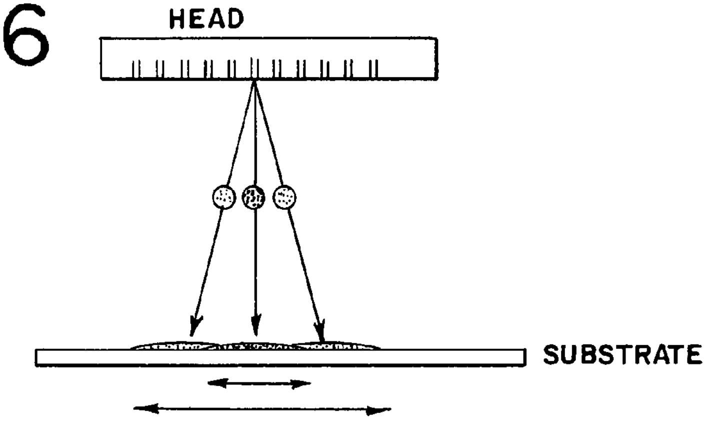
FIG. 6 is a sectional view to show a conventional technology.

Thereafter, the second conductive layers (source wiring, drain wiring) 417 to 422 are formed in such a way as to extend to the bottom portions of the contact holes. In this embodiment, a laminated structure formed of two kinds of metals was used as the second conductive layer in the contact hole. That is, a liquid in which nano fine niobium particles were diffused in an organic solvent by the use of a surface active agent was once discharged into the contact hole without using the electron beam to form a niobium layer and then a copper pattern was formed by using the electron beam in combination. Then, the heat treatment is performed. By the processes described above, a transistor could be formed on the substrate 401 having an insulating surface formed thereon. The sectional view at this time is shown in FIG. 4(D)).

Next, pixel electrodes 501, 502 made of a transparent conductive material are formed on the whole area in such a way as to be electrically connected to the second conductive layers 420, 422. The pixel electrodes 501, 502 are formed of, for example, a compound (ITO) of indium oxide and tin oxide, a compound of indium oxide and zinc oxide, zinc oxide, tin oxide, indium oxide, and titanium nitride. In this embodiment, an ITO film was formed in a thickness of 0.1 μm as the pixel electrodes 501, 502 by a method of using electron beam irradiation and liquid drop discharge in combination (FIG. 5(A)).

Thereafter, a process of forming a light emitting device by an organic EL starts. An insulating film 503 is formed in such a way as to cover the pixel electrodes 501, 502. A material for forming the insulating film 503 is not limited to a special one but the insulating film 503 can be formed of an inorganic or an organic material. Then, a region including the organic EL to become a light emitting layer is formed and light emitting layers 504, 505 are formed in sequence under reduced pressure or in a vacuum in such a way as to be brought into contact with the pixel electrodes 501, 502 (FIG. 5(B, C)). A material for forming the light emitting layers 504, 505 is not limited to a special material but in the case of color display, materials of colors of red, green, and blue are used. Next, the second pixel electrode (cathode) 506 is formed under reduced pressure or in a vacuum by a vapor deposition method (FIG. 5(D)).

The second pixel electrode (cathode) 506 is formed of a laminated film of a thin film containing metal having a small work function (lithium (Li), magnesium (Mg), cesium (Cs)), and a transparent conductive film laminated on the thin film containing Li, Mg, or the like. A film thickness can be set at a suitable value so as to function as a cathode and usually ranges from about 0.01 μm to 1 μm. In this embodiment, an alloy film (Al—Li) containing aluminum and lithium was formed as the second pixel electrode 506 in a thickness of 0.1 μm. Here, the second pixel electrode 506 is formed over the whole area.

A metal film widely used as the cathode is a metal film containing an element belonging to the first group or the second group of a periodic table and this metal film tends to be oxidized, so that it is desirable to protect its surface. Further, since a necessary film thickness is thin, it is recommended that a conductive film having a small resistance be provided in an auxiliary manner to reduce the resistance of the cathode and in addition to protect the cathode. A metal film whose main component is aluminum, copper, or silver is used as the conductive film having a small resistance.

The light emitting layers 504, 505 and the second pixel electrode 506 are formed by changing the composition discharged from the head 400 or by changing the head 400 filled with the composition. In this case, this can be performed without being opened to the atmosphere and hence leads to improving the reliability of the light emitting device susceptible to moisture or the like. To make the viscosity of the discharged composition at a desired value (50 cp or less), the composition is heated within a range from 150° C. to 300° C.

The laminated body of the first pixel electrodes 501, 502, the light emitting layers 504, 505, and the second pixel electrode 506 corresponds to the light emitting device. The first electrodes 501, 502 correspond to anodes and the second electrode 506 corresponds to a cathode. The excited state of the light emitting device includes a singlet excited state and a triplet excited state and light can be emitted by any of the two states.

In this embodiment has been shown a case where light emitted by the light emitting device is taken out of the substrate 401 side (bottom side), in other words, a case where light is emitted from the bottom surface. However, light may be taken out of the surface of the substrate 401, in other words, light may be emitted from the surface. In this case, it is recommended that the first pixel electrodes 501, 502 and the second pixel electrode 506 be formed in such a way as to correspond to the cathodes and the anode, respectively, and that the second pixel electrode 506 be formed of a transparent material. Further, it is preferable that a driving TFT is formed of an N channel type TFT. In this respect, the conduction type of the driving TFT may be changed as appropriate but a capacitance device is arranged in such a way as to keep voltage between the gate and source of the driving TFT. Here, while the case of a display device using the light emitting device has been described in this embodiment, the invention may be also applied to a liquid crystal display device using a liquid crystal device or other display devices.

The invention having the construction described above can provide a method of manufacturing a wiring, a conductive layer, and a display device that can respond to upsizing of a substrate and improves throughput and the efficiency of usage of materials.

Embodiment 3

Figure 8A:
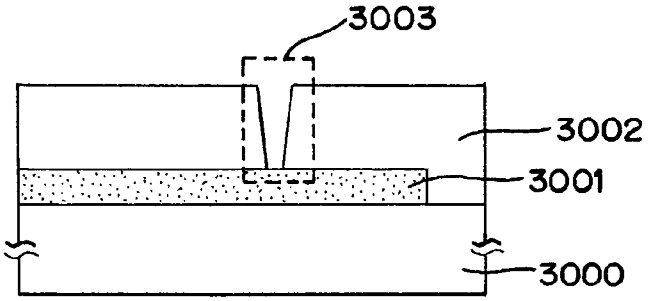
FIGS. 8(A)–8(C) are sectional views to show the manufacturing method of the invention.
Figure 8B:
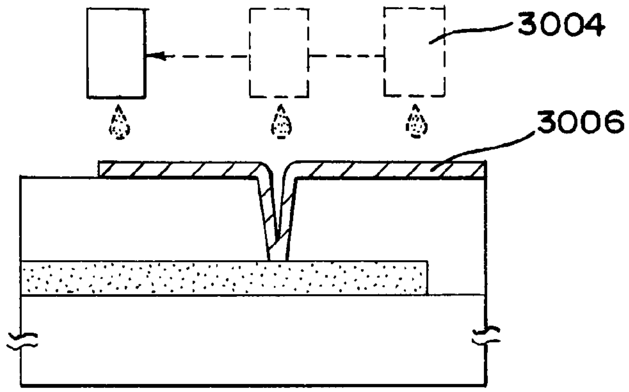
Figure 8C:
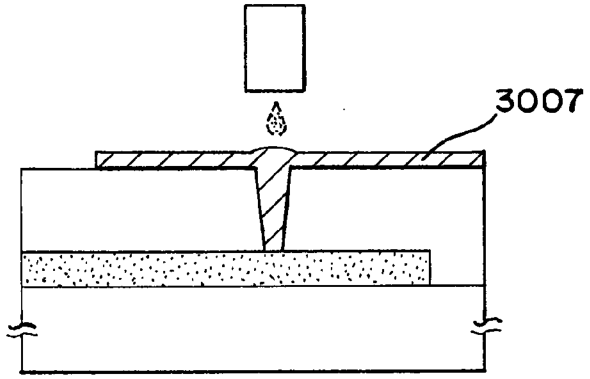
Figure 9A:
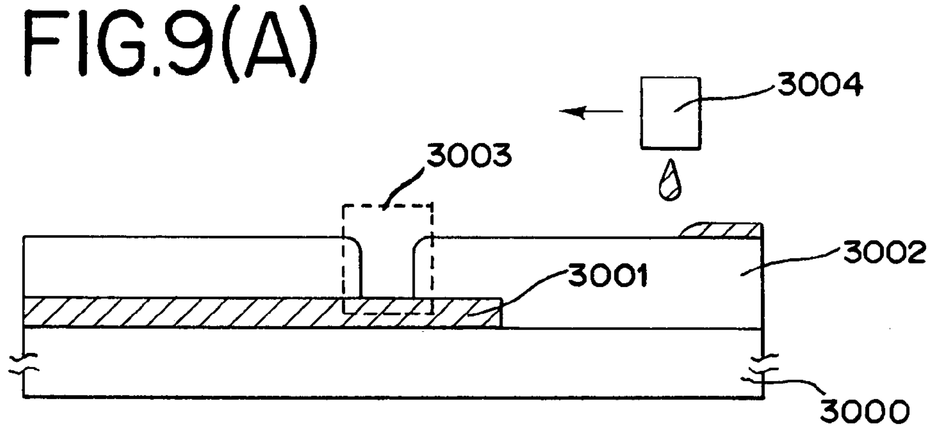
FIGS. 9(A)–9(C) are sectional views to show the manufacturing method of the invention.
Figure 9B:
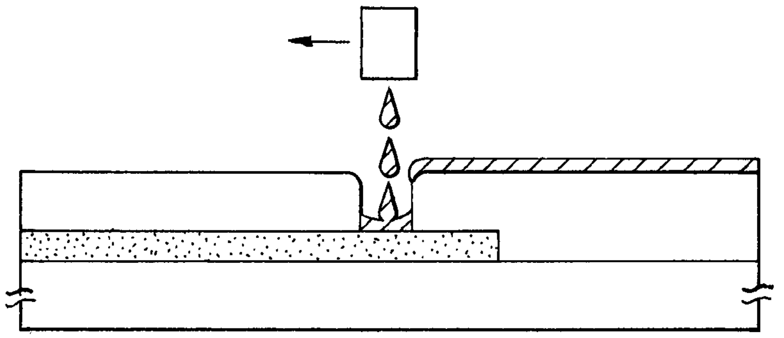
Figure 9C:
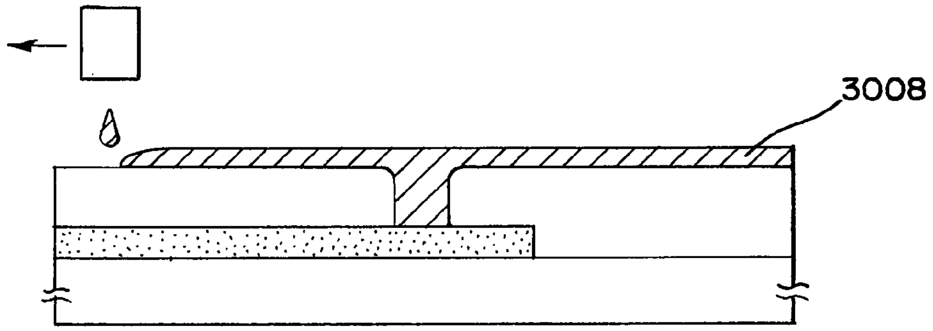

In this embodiment, a method of filling a contact hole (open hole) with a liquid drop composition by using the liquid drop discharge method will be described by the use of FIGS. 7 to 9.

Figure 7A:
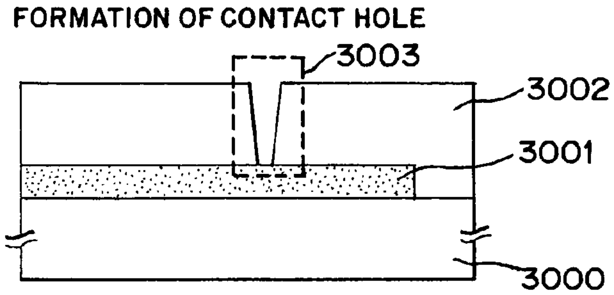
FIGS. 7(A)–7(C) are sectional views to show the manufacturing method of the invention.

In FIG. 7(A), a semiconductor 3001 is formed over a substrate 3000 and an insulator 3002 is formed over the semiconductor 3001 and the insulator 3002 has a contact hole 3003. A publicly known method can be used as a method of forming a contact hole but a liquid drop discharge method may be also used. In this case, a wet etching solution is discharged from a nozzle to form the contact hole 3003. Then, the contact hole and the wiring can be continuously formed by the liquid drop discharge method.

Figure 7B:
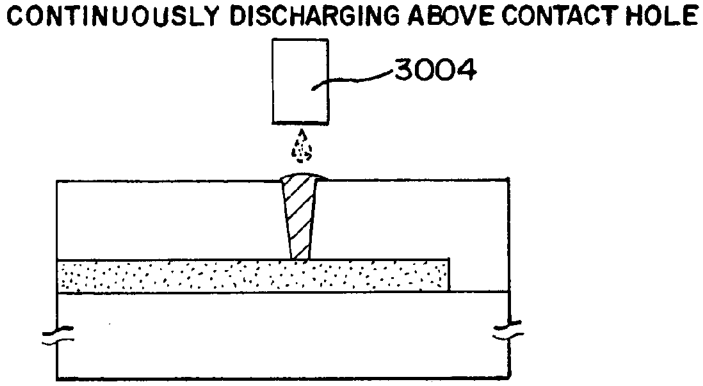
Figure 7C:
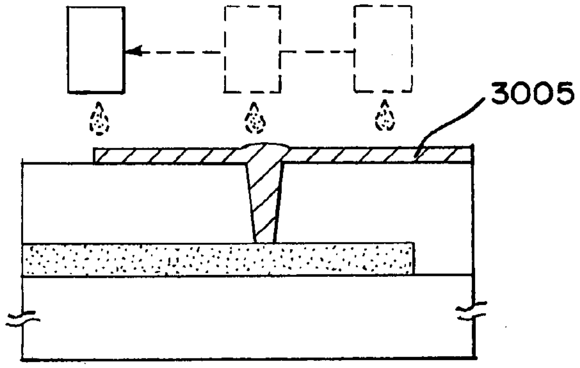

Then, a nozzle 3004 is moved above the contact hole 3003 and a liquid drop composition is continuously discharged to the contact hole 3003 to fill the contact hole 3003 with the liquid drop composition (FIG. 7(B)). Then, by resetting the position of the nozzle 3004 and discharging the liquid drop composition selectively, a conductor 3005 can be formed in which the contact hole 3003 is filled with the liquid drop composition (FIG. 7(C)). In this method, the nozzle 3004 scans the same portion at a plurality of times.

Next, a method different from the method described above will be described by the use of FIG. 8. In this method, the nozzle 3004 is moved and the liquid drop composition is discharged selectively only to a region where a wiring is to be formed to form a conductor 3006 (FIG. 8(B)). Then, the nozzle 3004 is moved above the contact hole 3003 and the liquid drop composition is continuously discharged to the contact hole 3003. As a result, a conductor 3007 can be formed in which the contact hole 3003 is filled with the liquid drop composition (FIG. 8(C)). In this method, the nozzle 3004 scans the same portion at a plurality of times.

Next, a method different from the method described above will be described by the use of FIG. 9. In this method, first, the nozzle 3004 is moved and the liquid drop composition is selectively discharged (FIG. 9(A)). Then, when the nozzle 3004 reaches above the contact hole 3003, the liquid drop composition is continuously discharged to fill the contact hole 3003 with the liquid drop composition (FIG. 9(B)). As a result, a conductor 3008 can be formed in which the contact hole 3003 is filled with the liquid drop composition (FIG. 9(C)). In this method, the nozzle 3004 does not scan the same portion at a plurality of times.

A conductor having also the contact hole filled with the liquid drop composition can be formed by the use of any one of the methods described above.

Figure 10:
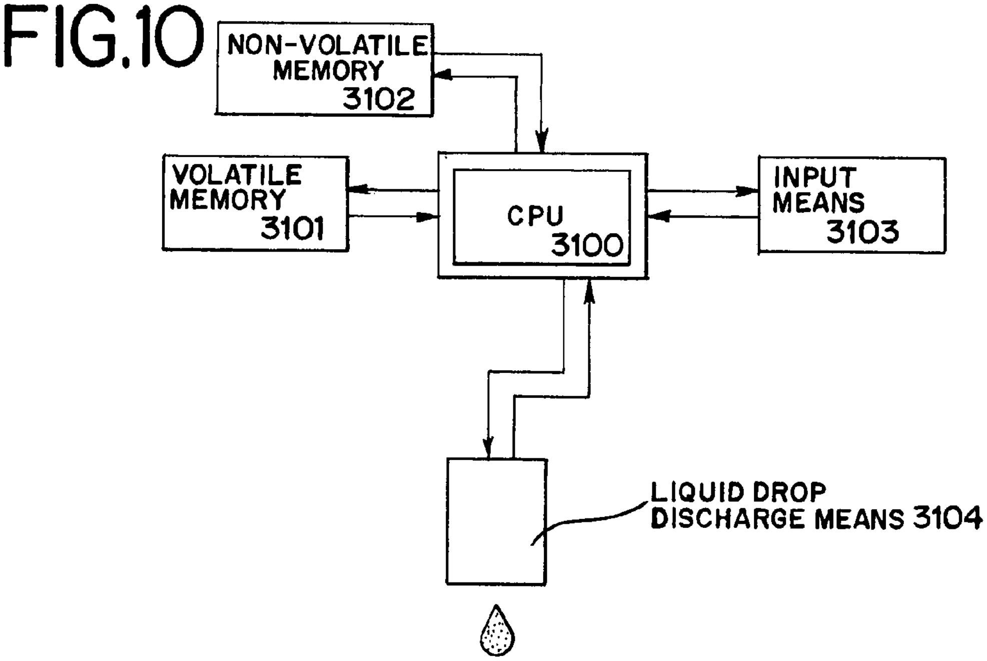
FIG. 10 is a system construction to show the manufacturing method of the invention.

In this respect, by the use of the liquid drop discharge method, a circuit wiring inputted to a personal computer can be manufactured immediately. A system for this operation will be described in brief by the use of FIG. 10.

Main constituent elements include a CPU 3100, a volatile memory 3101, a non-volatile memory 3102, input means 3103 such as a keyboard and an operating button, and a liquid drop discharge unit having liquid drop discharge means 3104. Describing its operation in brief, when the data of a circuit wiring is inputted by the input means 3103, this data is stored in the volatile memory 3101 or the non-volatile memory 3102 via the CPU 3100. The liquid drop discharge means 3104 discharges the liquid drop composition selectively on the basis of this data to form a wiring.

The construction described above can eliminate the need for providing a mask for the purpose of exposure and hence can reduce processes of exposure and development substantially. As a result, this can increase throughput and enhance productivity to a great extent. Further, this construction may be also used for the purpose of repairing a broken portion in a wiring and an impaired electric connection between the wiring and the electrode. In this case, it is suitable, for example, to input a repair portion to a personal computer and to discharge the liquid drop composition to the portion from the nozzle. Further, a wiring can be easily formed also on a large size substrate having one side exceeding at least 1 m and only a necessary amount of material needs to be applied to a desired portion, so that the wasted material can be reduced to the minimum, which realize an improvement in the efficiency of use of the material and a reduction in manufacturing cost.

Embodiment 4

The embodiment of the invention will be described in detail by the use of FIG. 12. Here, a process for forming a reverse stagger type TFT different from a normal stagger type TFT described in the embodiment 1 and the embodiment 2 will be described. In this regard, in the construction of the invention to be described below, the reference symbols designating the same parts are used in common throughout the different drawings.

The substrate described in the embodiment 1 can be used as a substrate 2000. In this embodiment, a glass substrate (#7059 made by Corning Corp.) is used.

Figure 12A:
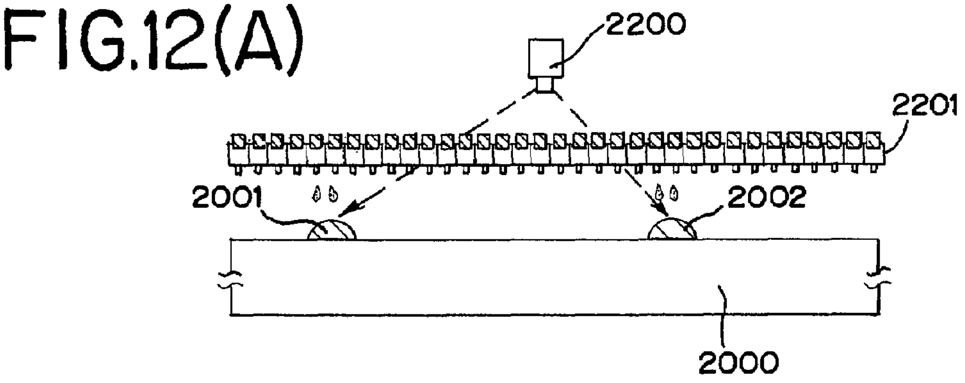
FIGS. 12(A)–12(D) are sectional views to show the manufacturing method of the invention.

Next, the first conductive layers (gate wiring, gate electrode, capacitor electrode) 2001, 2002 are formed over the substrate 2000 under reduced pressure or in a vacuum with by electron beam irradiation means 2200 and by liquid drop discharge means 2201 (FIG. 12(A)). In this embodiment, a gate pattern is formed by discharging a liquid in which nano fine particles of Al are diffused in an organic solvent by the use of a surface active agent. In particular, since a gate electrode pattern has a large effect on transistor characteristics, the concurrent use of irradiation with the electron beam is effective in the improvement of the performance of an active matrix type display. As described above, the electron beam was used for all the patterns in this embodiment, but it is also effective to use the electron beam, for example, only for a particularly important gate electrode portion.

The electron gun is provided with means for collecting the beam and means capable of scanning the beam to a desired position on the substrate. Further, the liquid drop discharge apparatus has many liquid drop injection nozzles. It is also recommended that a plurality of heads each having a different nozzle diameter be prepared and that a head having a different nozzle diameter be properly used in accordance with use. Here, the nozzle diameter of an ordinary head is 50 to 100 μm and, depending on the nozzle diameter, in consideration of throughput, in order to make it possible to form a pattern by a single scanning, it is also recommended that a plurality of nozzles be arranged in parallel in such a way as to be equal in length to one column or one row of the pattern. Further, it is also recommendable to arrange an arbitrary number of nozzles and to scan at a plurality of times or to scan the same portion at a plurality of times to apply the liquid in layers. Still further, it is preferable to scan the head, but it is also acceptable to move the substrate. To drop the liquid drop at a desired position, it is preferable that the distance between the substrate and the head is as short as possible, to be specific, about 0.1 mm to 2 mm.

Preferably, the amount of composition discharged at one time from the head is from 10 pl to 70 pl and viscosity is 100 cp or less and a particle diameter is 0.1 μm or less. This is because of preventing drying and because the composition can not be smoothly discharged from the discharge port if the viscosity is too high. The viscosity, surface tension, and drying rate of the composition are suitably adjusted in accordance with solvent to be used and use. It is desirable that the composition discharged from the head is continuously dropped on the substrate and is formed in the shape of a line or stripes. However, the composition may be dropped at desired positions, for example, for each one dot.

As the composition to be discharged from the head is used a material in which a conductive material suitably selected from: an element suitably selected from a group consisting of tantalum (Ta), tungsten (W), titanium (Ti), molybdenum (Mo), aluminum (Al), copper (Cu), chromium (Cr), and neodymium (Nd); an alloy material or a compound material whose main component is the element described above; and a AgPdCu alloy is dissolved or diffused in a solvent. As the solvent is used an ester group such as butyl acetate and ethyl acetate, an alcohol group such as isopropyl alcohol and ethyl alcohol, or an organic solvent such as methyl ethyl ketone and acetone. It is recommended that the concentration of the solvent be suitably determined according to the kinds of the conductive materials and the like.

Further, ultra-fine particles (nano metal particles) made by diffusing silver (Ag), gold (Au), or platinum (Pt) in a particle diameter of 10 nm or less may be used as the composition to be discharged from the head. In this manner, when the composition in which particles of a fine particle diameter are diffused or dissolved in the solvent is used, a problem that the nozzle is choked can be solved. In this regard, in the invention using the liquid drop discharge method, the particle diameter of the constituent material of the composition needs to be smaller than the diameter of the nozzle. Further, a conductive polymer (conductive macromolecule) such as polyethylene dioxi-thiophene/polystyrene sulfonic acid (PEDT/PSS) aqueous solution can be used.

Moreover, the use of a low-resistance metal such as silver and copper as a wiring material can reduce the resistance of the wiring and hence is preferable in the case of using a large substrate. In addition, it is difficult to work these metal materials by a usual dry etching method and hence it is extremely effective to pattern them directly by the liquid drop discharge method. However, for example, in the case of copper or the like, to prevent a detrimental effect on the electric characteristics of a transistor, it is preferable to provide a conductive film as a barrier to prevent diffusion. By the conductive film as a barrier, it is possible to form a wiring without copper being diffused in the semiconductor provided in the transistor. As the conductive film as a barrier can be used a film made of one element selected from a group of consisting of tantalum nitride (TaN), titanium nitride (TiN), and tungsten nitride (WN) or a laminated film made of a plurality of elements selected from the group. Further, since copper tends to be oxidized, it is preferable to use copper in combination with an oxidation inhibitor.

Thereafter, the substrate having the first conductive layer formed thereon is subjected to heat treatment under normal pressure or reduced pressure or in a vacuum within a range from 150° C. to 300° C. to volatilize the solvent to enhance the density of the composition to reduce resistance. However, as to the solvent in the composition discharged from the head, a solvent that volatilizes after the composition drops on the substrate is suitably used. A case like this embodiment where the liquid drop is discharged in a vacuum is characterized in that a volatilizing rate is larger as compared with a usual case where the liquid drop is discharged under atmospheric pressure. In particular, when a highly volatile solvent such as toluene is used, the solvent volatilizes instantaneously after the composition is dropped on the substrate. In such a case, a process of heat treatment can be omitted. However, the solvent of the composition is not limited to a special one, but even in a case where a solvent is used that volatilizes after the composition drops, it is also recommended that the composition be subjected to the heat treatment to have the density thereof enhanced to have a desired resistance. Further, this heat treatment may be performed every time the thin film is formed by the liquid drop discharge method or may be performed for each arbitrary process or may be performed by one operation after all the processes are finished.

The heat treatment is performed by the use of a lamp annealing unit for heating a substrate directly at a high heating rate by using a lamp such as halogen lamp as a heating source or a laser irradiation unit for irradiating laser light. Both units can subject only a desired portion to the heat treatment by scanning the heating source. A furnace annealing set at a desired temperature may be also used as another method. However, in the case of using a lamp, it is preferable to use light having a wavelength that does not break the composition of the thin film to be subjected to the heat treatment but can only heat it, for example, light having a wavelength longer than 400 nm, that is, light having a wavelength longer than infrared ray. It is preferable to use far-infrared ray (typical wavelength is 4 μm to 25 μm) from the viewpoint of easy handling. Further, in the case of using laser light, it is preferable that a beam spot on the substrate of the laser light emitted from a laser oscillation unit is formed in the shape of a line in such a way as to be equal in length to the length of the column or the row of the pattern. With this, it is possible to finish laser irradiation by one scanning. In this embodiment, a usual furnace annealing was used as the heat treatment.

Next, a gate insulating film 2003 is formed in such a way as to cover the first conductive layers 2001, 2002. As the gate insulating film 2003 can be used an insulating film made of, for example, silicon oxide, silicon nitride, or silicon nitride oxide. As to the gate insulating film 2003, an insulating film of a single layer may be used or a plurality of insulating films may be laminated. In this embodiment, an insulating film in which silicon nitride, silicon oxide, and silicon nitride are laminated in this order is used as the gate insulating film 2003. Further, the plasma CVD method or the sputtering method can be used as a method for forming the film. To form a dense insulating film capable of preventing a gate leak current at a low film forming temperature, it is recommendable to make a reaction gas contain a rare gas such as argon and to mix it into the insulating film to be formed. Further, aluminum nitride can be used as the gate insulating film 2003. The aluminum nitride has a comparatively high thermal conductivity and hence can efficiently dissipate heat generated in the TFT.

Next, the first semiconductor film 2004 is formed. The first semiconductor film 2004 can be formed of amorphous semiconductor or semi-amorphous semiconductor (SAS). Further, the first semiconductor film 2004 may be formed of polycrystalline semiconductor. In this embodiment, semi-amorphous semiconductor is used as the first semiconductor film 2004. The semi-amorphous semiconductor is higher in crystallization and mobility than the amorphous semiconductor and can be formed without increasing a process for crystallization, which is different from the polycrystalline semiconductor.

The amorphous semiconductor can be produced by decomposing a silicon containing gas by the use of glow discharge. Typical silicon containing gas includes $SiH_4$ and $Si_2H_6$. This silicon containing gas may be diluted for use with hydrogen, or hydrogen and helium.

Further, the SAS can be also produced by decomposing a silicon containing gas by the use of glow discharge. Typical silicon containing gas is $SiH_4$. In addition to this, $Si_2H_6$, $SiH_2Cl_2$, $SiHCl_3$, $SiCl_4$, and $SiF_4$ can be also used. This silicon containing gas is diluted for use with hydrogen or a gas obtained by adding one rare gas element or a plurality of rare gas elements selected from a group consisting of helium, argon, krypton, and neon to hydrogen, thereby to form the SAS easily. It is preferable to dilute the silicon containing gas within a range of dilution ratio from 2 to 1000 times. Further, it is also recommended that the silicon containing gas be mixed with a carbide gas such as $CH_4$ and $C_2H_6$, a germanide gas such as $GeH_4$, $GeF_4$, and $F_2$ to adjust an energy band width within a range from 1.5 to 2.4 eV or a range from 0.9 to 1.1 eV.

A TFT using the SAS as the first semiconductor film can have a mobility of 1 to 10 $cm^2$/Vsec or more.

Further, it is also recommended that a plurality of layers of SAS formed of different gases be formed to form the first conductive film. For example, a SAS layer formed of a gas containing a fluorine element among the various kinds of gases described above and a SAS layer formed of a gas containing a hydrogen element are laminated to form the first semiconductor film.

The reaction and generation of a film by the glow discharge decomposition can be conducted under reduced pressure or atmospheric pressure. In the case of being conducted under reduced pressure, it is recommended to set the pressure within a range from approximately 0.1 Pa to 133 Pa. It is recommendable to supply high-frequency power of from 1 MHz to 120 MHz, preferably, from 13 MHz to 60 MHz as power for generating the glow discharge. It is recommended that pressure ranges from approximately 0.1 Pa to 133 Pa and that power frequency ranges from 1 MHz to 120 MHz, preferably, from 13 MHz to 60 MHz. It is recommended that the heating temperature of the substrate is 300° C. or less, preferably, from 100 to 200° C. It is preferable that the impurity content of atmosphere such as oxygen, nitrogen, and carbon is $1\times10^{20}$ atoms/$cm^3$ or less and that, in particular, the concentration of oxygen is $5\times10^{19}$ atoms/$cm^3$ or less, preferably, $1\times10^{19}$ atoms/$cm^3$ or less.

In this respect, in the case of forming the semiconductor film by the use of $Si_2H_6$ and $GeF_4$ or $F_2$, a crystal grows from a side closer to the substrate of the semiconductor film, so that the crystallization of the semiconductor film is higher in a portion closer to the substrate. Hence, in the case of a bottom gate type TFT in which the gate electrode is closer to the substrate than to the first semiconductor film, a region that is closer to the substrate and is higher in crystallization of the first semiconductor film can be used as a channel forming region and hence can be further enhanced in mobility and is more suitable.

Further, in the case of forming the semiconductor film by the use of $SiH_4$ and $H_2$, a crystal grain can be made larger in a region closer to the surface of the semiconductor film. Hence, in the case of a top gate type TFT in which the first semiconductor film is closer to the substrate than to the gate electrode, a region that is farther from the substrate and is higher in crystallization of the first semiconductor film can be used as a channel forming region and hence can be further enhanced in mobility and is more suitable.

Still further, the SAS shows a weak N type conduction mode when an impurity for the purpose of valence control is not intentionally added. This is because since glow discharge is developed at higher power than when the amorphous semiconductor film is formed, oxygen is easily mixed into the semiconductor film. Hence, it is possible to control a threshold by adding an impurity to provide a P type to the first semiconductor film formed in the channel forming region of the TFT at the same time when the first semiconductor film is formed or after it is formed. A typical impurity to provide the P type is boron and it is recommended that an impurity gas such as $B_2H_6$ and $BF_3$ be added to the silicon containing gas at a rate from 1 ppm to 1000 ppm. For example, in the case of using boron as an impurity to provide the P type, it is recommended to make the concentration of boron $1\times10^{14}$ atoms/$cm^3$ to $6\times10^{16}$ atoms/$cm^3$.

Next, protective films 2005, 2006 are formed over the first semiconductor film 2004 in such a way as to overlap a portion to become a channel forming region of the first semiconductor film 2004. The protective films 2005, 2006 may be formed by the use of the liquid drop discharge method, a printing method, the CVD method, or the sputtering method. As the protective films 2005, 2006 can be used an inorganic insulating film made of silicon oxide, silicon nitride, and silicon nitride oxide, and a siloxane base insulating film. Alternatively, it is also recommended that these films be laminated and be used as the protective films 2005, 2006. In this embodiment, a silicon nitride insulating film formed by the plasma CVD method and a siloxane base insulating film formed by the liquid drop discharge method are laminated and used as the protective films 2005, 2006. In this case, the silicon nitride insulating film can be patterned by using the siloxane base insulating film formed by the liquid drop discharge method as a mask.

Figure 12B:
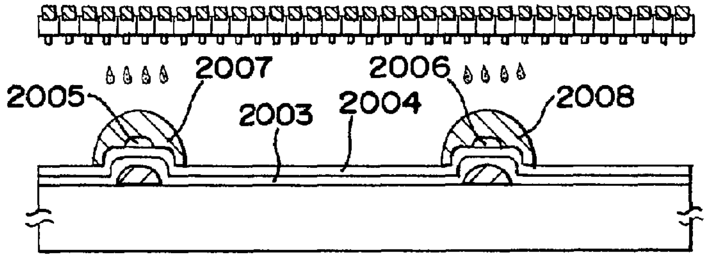
Figure 12C:
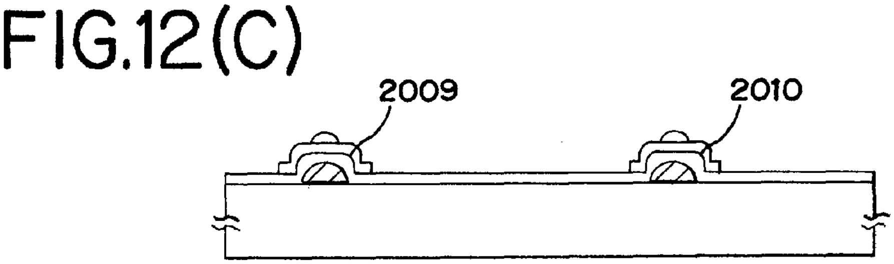
Figure 12D:
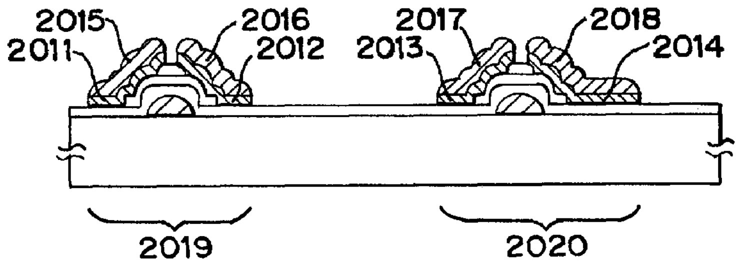

Next, as shown in FIG. 12(B), the first semiconductor film 2004 is patterned. The first semiconductor film 2004 may be patterned by the lithography or by using a resist formed by the liquid drop discharge method as a mask. In the latter case, it is not necessary to prepare a mask for exposure separately, which leads to cost reduction. In this embodiment, an example will be described in which the first semiconductor film is patterned by the use of resists 2007, 2008 formed by the liquid drop discharge method. Here, the resists 2007, 2008 can be formed of an organic resin such as polyimide and acrylic. The patterned first semiconductor films 2009, 2010 are formed by the dry etching using the resists 2007, 2008 (FIG. 12(C)).

Next, the second semiconductor film is formed in such a way as to cover the patterned first semiconductor films 2009, 2010. An impurity for providing one conduction type is added to the second semiconductor film. In the case of forming an n-channel type TFT, it is recommendable to add an impurity for providing the N type, for example, phosphorus to the second semiconductor film. To be specific, it is recommendable to add an impurity gas such as $PH_3$ to a silicon containing gas to form the second semiconductor film. The second semiconductor having one conduction type can be formed of the semi-amorphous semiconductor or the amorphous semiconductor as is the case with the first semiconductor films 2009, 2010.

Incidentally, in this embodiment, the second semiconductor film is formed in such a way as to be in contact with the first semiconductor films 2009, 2010, but the invention is not limited to this construction. The third semiconductor film functioning as an LDD region may be formed between the first semiconductor film and the second semiconductor film. In this case, the third semiconductor film is formed of the semi-amorphous semiconductor or the amorphous semiconductor. The third semiconductor film inherently shows a weak N conduction type even if an impurity for providing a conduction type is not intentionally added. Hence, even if an impurity for providing a conduction type is not added to the third semiconductor film, the third semiconductor film can be used as an LDD region.

Next, wirings 2015 to 2018 are formed by the liquid drop discharge method and the second semiconductor film is etched by using the wirings 2015 to 2018 as a mask. The second semiconductor film can be etched dry etching under a vacuum atmosphere or under an atmospheric pressure atmosphere. By the dry etching, the second semiconductors 2011 to 2014 functioning as a source region or a drain region are formed from the second semiconductor film. The protective films 2005, 2006 can prevent the first semiconductor films 2009, 2010 from being over-etched when the second semiconductor film is etched.

The wirings 2015 to 2018 can be formed in the same way as the first conductive layers 2001, 2002. To be specific, a conductive material containing one or a plurality of substances selected from a group of metals Ag, Au, Cu, Pd and metal alloys thereof is used. In the case of using the liquid drop discharge method, the wirings 2015 to 2018 can be formed by dropping a composition in which the conductive material is diffused in an organic or inorganic solvent from the nozzle and by drying or baking the composition at room temperature. A conductive material containing one or a plurality of substances selected from a group of metals Cr, Mo, Ti, Ta, W, Al and metal alloys thereof can be also used if a dispersing agent can prevent the conductive material from aggregating to diffuse the conductive material in the solution. It is also recommended that the baking be performed in an oxygen atmosphere to reduce the resistances of the wirings 2015 to 2018. By forming conductive films of the conductive material at a plurality of times by the liquid drop discharge method, wirings 2015 to 2018 having a plurality of conductive films laminated can be also formed.

A switching TFT 2019 and a driving TFT 2020 can be formed by the process described above (FIG. 12(D)).

In FIG. 12, the first semiconductor film and the second semiconductor film are patterned by the different processes, but the manufacturing method of the semiconductor device of this invention is not limited to this manufacturing method.

Further, the protective film is formed between the first semiconductor film and the second semiconductor film, but the invention is not limited to this construction and the protective film is not necessarily required to be formed.

Further, the materials and forming methods that have been described in this embodiment can be suitably selected for use in accordance with the spirit of the invention.

Incidentally, this embodiment can be carried out in combination with the constructions described in the other embodiments.

The invention claimed is:

1. A method for making a pattern, comprising:

selectively irradiating a desired portion of a substrate having an insulating film with a charged beam to get a charged pattern by only the charged beam;

charging a liquid drop with an electric charge of a polarity opposite to the charged beam; and discharging the charged liquid over the substrate.

2. The method for making a pattern as claimed in claim 1, wherein the charged beam is an electron beam.

3. The method for making a pattern as claimed in claim 1, wherein the charged beam is an ion beam.

4. The method for making a pattern as claimed in any one of claims 1 to 3, wherein said discharging is performed under reduced pressure.

5. The method for making a pattern as claimed in any one of claims 1 to 4, wherein the liquid drop contains fine metal particles.

6. The method for making a pattern as claimed in any one of claims 1 to 5, wherein the liquid drop comprises a solution containing a resist material.

7. The method for making a pattern as claimed in any one of claims 1 to 6, wherein the liquid drop comprises a solution containing a silicon compound.

8. The method for making a pattern as claimed in claim 1, wherein the step of charging the liquid drop is conducted by keeping a head at a high electric potential.

9. The method according to claim 1, wherein the irradiating step is conducted by moving a charged beam source.

10. The method according to claim 1, wherein the irradiating step is conducted by scanning the charged beam.

11. A method for forming a semiconductor device comprising:

forming a semiconductor film over a substrate;

forming a gate insulating film over said semiconductor film;

selectively irradiating a pail of said gate insulating film with a charged beam to get a charged pattern by only the charged beam;

charging a liquid drop with an electric charge of a polarity opposite to said charged beam; and discharging said charged liquid drop over said gate insulating film to form a gate electrode over said gate insulating film.

12. The method according to claim 11 wherein said liquid drop comprises a solvent and a conductive material provided in said solvent and comprising a material selected from the group consisting of silver, gold, platinum, tantalum, tungsten, titanium, molybdenum, aluminum, copper, chromium, neodymium, an alloy thereof, a compound material thereof, and a AgPdCu alloy.

13. The method according to claim 12 wherein said solvent comprises a material selected from an ester group, an alcohol group, methyl ethyl ketone and acetone.

14. The method according to claim 11 wherein said charged beam is an electron beam.

15. The method according to claim 11 wherein said charged beam is an ion beam.

16. The method according to claim 11, wherein the step of charging the liquid drop is conducted by keeping a head at a high electric potential.

17. The method according to claim 11, wherein the irradiating step is conducted by moving a charged beam source.

18. The method according to claim 11, wherein the irradiating step is conducted by scanning the charged beam.

19. A method for forming a semiconductor device comprising:

selectively irradiating a part of an insulating surface with a charged beam to get a charged pattern by only the charged beam;

charging a liquid drop with an electric charge of a polarity opposite to said charged beam;

discharging said charged liquid drop over said insulating surface to form a gate electrode over said insulating surface;

forming a gate insulating film over said gate electrode; and forming a semiconductor film over said gate insulating film.

20. The method according to claim 19 wherein said liquid drop comprises a solvent and a conductive material provided in said solvent and comprising a material selected from the group consisting of silver, gold, platinum, tantalum, tungsten, titanium, molybdenum, aluminum, copper, chromium, neodymium, an alloy thereof, a compound material thereof, and a AgPdCu alloy.

21. The method according to claim 20 wherein said solvent comprises a material selected from an ester group, an alcohol group, methyl ethyl ketone and acetone.

22. The method according to claim 19 wherein said charged beam is an electron beam.

23. The method according to claim 19 wherein said charged beam is an ion beam.

24. The method according to claim 19, wherein the step of charging the liquid drop is conducted by keeping a head at a high electric potential.

25. The method according to claim 19, wherein the irradiating step is conducted by moving a charged beam source.

26. The method according to claim 19, wherein the irradiating step is conducted by scanning the charged beam.

27. A method for forming a semiconductor device comprising:

forming a semiconductor film over a substrate;

forming a gate electrode adjacent to said semiconductor film;

forming an insulating film over said semiconductor film and said gate electrode;

selectively irradiating a part of said insulating film with a charged beam to act a charged pattern by only the charged beam;

charging a liquid drop with an electric charge of a polarity opposite to the charged beam; and discharging said charged liquid drop over said insulating film to form a pixel electrode over said insulating film.

28. The method according to claim 27 wherein said insulating film comprises silicon nitride.

29. The method according to claim 27 wherein said charged beam is an electron beam.

30. The method according to claim 27 wherein said charged beam is an ion beam.

31. The method according to claim 27, wherein the step of charging the liquid drop is conducted by keeping a head eta high electric potential.

32. The method according to claim 27, wherein the irradiating step is conducted by moving a charged beam source.

33. The method according to claim 27, wherein the irradiating step is conducted by scanning the charged beam.

* * * * *